(12) United States Patent
Harazono

(10) Patent No.: US 10,319,766 B2
(45) Date of Patent: Jun. 11, 2019

(54) PACKAGED OPTICAL DEVICE WITH SEALING RESIN AND METHOD OF MANUFACTURING PACKAGED OPTICAL DEVICE

(71) Applicant: MICRO MODULE TECHNOLOGY CO., LTD., Kanagawa (JP)

(72) Inventor: Fumikazu Harazono, Kanagawa (JP)

(73) Assignee: MICRO MODULE TECHNOLOGY CO., LTD., Kanagawa (JP)

( * ) Notice: Subject to any disclaimer, the term of this patent is extended or adjusted under 35 U.S.C. 154(b) by 0 days.

(21) Appl. No.: 15/994,549

(22) Filed: May 31, 2018

(65) Prior Publication Data

US 2018/0277583 A1    Sep. 27, 2018

Related U.S. Application Data

(63) Continuation of application No. PCT/JP2016/085558, filed on Nov. 30, 2016.

(30) Foreign Application Priority Data

Dec. 2, 2015   (JP) .................................. 2015-235357

(51) Int. Cl.
  *H01L 27/146*  (2006.01)
  *H01L 23/02*  (2006.01)
  (Continued)

(52) U.S. Cl.
  CPC ........ *H01L 27/14625* (2013.01); *H01L 23/02* (2013.01); *H01L 27/14* (2013.01);
  (Continued)

(58) Field of Classification Search
  CPC ......... H01L 27/14625; H01L 27/14636; H01L 27/14621; H01L 27/14618; H01L 27/14; H01L 23/02; H04N 5/2253; H04N 5/2258
  See application file for complete search history.

(56) References Cited

U.S. PATENT DOCUMENTS 5,636,099 A * 6/1997 Sugawara ............... H05K 1/162
                                                  361/277
9,502,455 B2 * 11/2016 Akahoshi .......... H01L 27/14618
(Continued)

FOREIGN PATENT DOCUMENTS

JP   H11-220115 A   8/1999
JP   2001-68595 A   3/2001
(Continued)

OTHER PUBLICATIONS

International Search Report issued in PCT/JP2016/085558 dated Feb. 14, 2017 with English Translation (5 pages).
(Continued)

*Primary Examiner* — John P. Dulka
(74) *Attorney, Agent, or Firm* — Nakanishi IP Associates, LLC

(57) ABSTRACT

First, a three-dimensional substrate is placed such that the rear surface is oriented upward. Next, a translucent member is placed inside a recessed portion so as to cover a through-hole by bringing a first surface of the translucent member into contact with a protruding portion. Next, an element is placed on the rear surface of the three-dimensional substrate so as to cover the recessed portion. Next, a sealing resin is filled between three-dimensional substrate and the element, between the element and a second surface of the translucent member that opposes the first surface, between a side surface of the translucent member and the three-dimensional substrate, and between the first surface of the translucent member and the three-dimensional substrate. In this way, the element and the translucent member are integrated with the three-dimensional substrate.

16 Claims, 15 Drawing Sheets

(51) Int. Cl.
  *H01L 27/14* (2006.01)
  *H04N 5/225* (2006.01)

(52) U.S. Cl.
  CPC .. *H01L 27/14618* (2013.01); *H01L 27/14621* (2013.01); *H01L 27/14636* (2013.01); *H04N 5/2253* (2013.01); *H04N 5/2258* (2013.01)

(56) References Cited

U.S. PATENT DOCUMENTS

| | | | |
|---|---|---|---|
| 9,780,135 B2 * | 10/2017 | Nagata | H01L 27/14634 |
| 2003/0094665 A1 * | 5/2003 | Harazono | H01L 27/14618 257/432 |
| 2003/0128291 A1 * | 7/2003 | Harazono | H01L 27/14618 348/374 |
| 2004/0069998 A1 * | 4/2004 | Harazono | H01L 27/14618 257/81 |
| 2005/0270403 A1 * | 12/2005 | Adachi | H01L 27/14618 348/340 |
| 2008/0186583 A1 * | 8/2008 | Takayama | G02B 27/0018 359/601 |
| 2010/0002107 A1 * | 1/2010 | Harazono | H01L 27/14618 348/294 |
| 2010/0103296 A1 * | 4/2010 | Nakagiri | H01L 27/14618 348/294 |
| 2015/0206864 A1 * | 7/2015 | Harazono | H01L 25/18 257/329 |
| 2018/0277583 A1 * | 9/2018 | Harazono | H04N 5/2253 |

FOREIGN PATENT DOCUMENTS

| | | |
|---|---|---|
| JP | 2008-124923 A | 5/2008 |
| JP | 2008-148222 A | 6/2008 |
| JP | 2009-218918 A | 9/2009 |

OTHER PUBLICATIONS

Written Opinion of International Searching Authority issued in PCT/JP2016/085558 dated Feb. 14, 2017 (5 pages).

* cited by examiner

PACKAGED OPTICAL DEVICE WITH SEALING RESIN AND METHOD OF MANUFACTURING PACKAGED OPTICAL DEVICE

CROSS-REFERENCE TO RELATED APPLICATIONS

This application is a continuation application of International Patent Application No. PCT/JP2016/085558 filed on Nov. 30, 2016, which claims priority to Japanese Patent Application No. 2015-235357 filed on Dec. 2, 2015, the entire contents of which are incorporated by reference.

TECHNICAL FIELD

The present invention relates to an optical device and a method of manufacturing an optical device.

BACKGROUND ART

Patent Document 1 discloses a solid state imaging device including a substrate, a solid state imaging element mounted on the substrate, and a translucent member disposed on the substrate and separated from an imaging region of the solid state imaging element by an optical space. The solid state imaging device described in Patent Document 1 is manufactured by applying an adhesive agent to a stepped portion formed at the periphery of a through-hole portion and placing an optical filter thereon, mounting a solid state imaging element on the substrate, and filling a photo-curable sealing resin between the substrate and the solid state imaging element while irradiating light.

CITATION LIST

Patent Document

Patent Document 1: JP 2009-218918 A

In the cited Patent Document 1, as the step of applying the adhesive agent to the stepped portion and the step of filling the photo-curable sealing resin are separate steps, there are problems in that there are a large number of steps and an increased cost. Also, as the number of steps increases, there is a possibility of dust contamination; that is, a greater probability of defects due to dust.

Further, in the cited Patent Document 1, as the step of applying the adhesive agent to the stepped portion and the step of filling the photo-curable sealing resin are separate steps, it is necessary to form an air hole between the translucent member and the substrate to remove air when filling the sealing resin. As the adhesive agent cannot be applied to the part that will serve as the air hole, it is not so simple to apply the adhesive agent to the entire surface of the stepped portion in the step of applying the adhesive agent. For this reason, there is a problem that process management, such as management of the position where the adhesive agent is to be applied, the amount to be applied, and the like, becomes complicated.

SUMMARY OF INVENTION

One or more embodiments of the present invention have been made to provide a compact optical apparatus with a low likelihood of defects due to dust. Another object of the present invention is to provide a method of manufacturing an optical device capable of reliably sealing an element and a translucent member in a single step.

An optical device according to one or more embodiments of the present invention, for example, includes: a three-dimensional substrate having a three-dimensional shape; an element which is provided on the three-dimensional substrate, where the element is a light receiving element for receiving light or a light emitting element for emitting light; and a translucent member provided on the three-dimensional substrate, wherein the three-dimensional substrate includes: a recessed portion formed on a rear surface, a through-hole penetrating in a plate thickness direction, where one end of the through-hole is formed in a bottom surface of the recessed portion, four protruding portions having a columnar shape formed on the bottom surface of the recessed portion, where the four protruding portions are formed so as not to come into contact with a side surface of the recessed portion and to cover each of four corners of the through-hole; the translucent member is provided inside the recessed portion to cover the through-hole; the element is provided on the rear surface of the three-dimensional substrate to cover the recessed portion; a first surface of the translucent member abuts the protruding portion; and the element and the translucent member are integrated with the three-dimensional substrate by a sealing resin filled between the three-dimensional substrate and the element, between a second surface opposed to the first surface of the translucent member and the element, between a side surface adjacent to the first surface and the second surface of the translucent member and the three-dimensional substrate, and between the first surface of the translucent member and the three-dimensional substrate.

According to the optical device of the one or more embodiments of present invention, the element and the translucent member are integrated with the three-dimensional substrate by a sealing resin filled between the three-dimensional substrate and the element, between a second surface opposed to the first surface of the translucent member and the element, between a side surface adjacent to the first surface and the second surface of the translucent member and the three-dimensional substrate, and between the first surface of the translucent member and the three-dimensional substrate. In this way, it is possible to reliably seal the element and the translucent member in a single step. In addition, as the element and the translucent member are sealed in one step, the likelihood of defects due to dust can be reduced. Further, as there are four protruding portions formed on the bottom surface of the recessed portion so as not to come into contact with a side surface of the recessed portion and so as to cover each of the four corners of the through-hole, it is possible to prevent the four corners from being filled with the sealing resin, such that the optical device can be downsized.

Here, the sealing resin may include a particulate filler material, and the protruding portion may be formed at a height of greater or equal to twice the maximum particle diameter of the filler material. In this way, it is possible to increase the speed with which the sealing resin permeates between the three-dimensional substrate and the translucent member, thereby improving productivity.

Here, an adhesive agent for preliminarily fixing the translucent member may be applied to the bottom surface of the recessed portion on an outer side of the protruding portion. By preliminarily fixing the translucent member with an adhesive agent, it is possible to prevent the translucent member from moving when filling the sealing resin, and the translucent member can be positioned in the height direction.

Here, the sealing resin may be a resin having light shielding characteristics, and the sealing resin may cover the entire rear surface of the element. In this way, in addition to integrating the element and the translucent member with the three-dimensional substrate in a single step, it is also possible to prevent light from entering the element from the rear surface of the element.

Here, the optical device further includes a substantially plate-shaped electrode provided on a surface of the element that is not opposed to the three-dimensional substrate, and the sealing resin may integrate the electrode and the element as well as the electrode and the three-dimensional substrate. In this way, it is possible to suppress temperature increase of the element. In addition, it is possible to prevent light from entering the device from the rear surface of the element.

Here, the optical device may further includes a flexible substrate including a circuit pattern formed of a metal foil formed on a substantially rectangular film-like base material formed of an insulating material; wherein the element includes a bump formed of a conductive material; an end portion of the flexible substrate is provided on the rear surface of the three-dimensional substrate; the element is provided on the rear surface of the three-dimensional substrate to sandwich the flexible substrate with the rear surface of the three-dimensional substrate; and the protruding portion and the circuit pattern are in contact with each other when the element is provided on the rear surface of the three-dimensional substrate. In this way, by integrating the flexible substrate with the solid state imaging device, there is no need to separately provide a substrate or wiring on the three-dimensional substrate. This makes it possible to downsize manufactured devices equipped with solid state imaging devices in which flexible substrates are integrated. In particular, this is effective when applied to equipment requiring miniaturization, such as endoscopes or the like.

An optical device according to one or more embodiments of the present invention, for example, includes: a three-dimensional substrate having a three-dimensional shape; two elements including a first element and a second element provided on the three-dimensional substrate, where the first element and the second element are light receiving elements for receiving light or light emitting elements for emitting light; and a first translucent member and a second translucent member provided on the three-dimensional substrate, wherein the three-dimensional substrate includes: a first recessed portion and a second recessed portion formed on a rear surface, a first through-hole which penetrates in a plate thickness direction and has one end formed in a bottom surface of the first recessed portion, a second through-hole which penetrates in the plate thickness direction and has one end formed in a bottom surface of the second recessed portion, four first protruding portions having a columnar shape formed on the bottom surface of the first recessed portion, where the four first protruding portions are formed not to come into contact with a side surface of the first recessed portion and to cover each of four corners of the through-hole, and four second protruding portions having a columnar shape formed on the bottom surface of the second recessed portion, where the four second protruding portions are formed not to come into contact with a side surface of the second recessed portion and to cover each of four corners of the through-hole; the first translucent member is provided inside the first recessed portion to cover the first through-hole; the second translucent member is provided inside the second recessed portion to cover the second through-hole; the first element is provided on the rear surface of the three-dimensional substrate to cover the first recessed portion; the second element is provided on the rear surface of the three-dimensional substrate to cover the second recessed portion; a first surface of the first translucent member abuts the first recessed portion, and a third surface of the second translucent member abuts the second recessed portion; the first element and the first translucent member are integrated with the three-dimensional substrate by a sealing resin filled between the three-dimensional substrate and the first element, between a second surface opposed to the first surface of the first translucent member and the first element, between a side surface adjacent to the first surface and the second surface and the three-dimensional substrate, and between the first surface and the three-dimensional substrate; and the second element and the second translucent member are integrated with the three-dimensional substrate by a sealing resin to be filled between the three-dimensional substrate and the second element, between a fourth surface opposed to the third surface of the second translucent member and the first element, between a side surface adjacent to the third surface and the fourth surface and the three-dimensional substrate, and between the third surface and the three-dimensional substrate. In this way, by reliably sealing the two elements and the two translucent members in each single step, it is possible to assemble the solid state imaging device for a compound eye camera in a small number of steps. In addition, as two elements and two translucent members are sealed in one step, the likelihood of defects due to dust can be reduced. Further, as there are four protruding portions formed on the bottom surface of the recessed portion not to come into contact with a side surface of the recessed portion and to cover each of the four corners of the through-hole, it is possible to prevent the four corners from being filled with the sealing resin, such that the optical device can be downsized.

Here, a widest surface of the three-dimensional substrate is a substantially rectangular plate-shaped member, and each of the first recessed portion and the second recessed portion are respectively formed near both ends in a longitudinal direction of the three-dimensional substrate. In this way, the base length of the compound eye camera can be made as long as possible in compact optical devices.

Here, a rib is formed in a region between the first recessed portion and the second recessed portion on the rear surface of the three-dimensional substrate, and a plurality of band-shaped wires are formed outside the region where the rib is formed. In this way, it is possible to prevent warping or the like of the three-dimensional substrate.

A method of manufacturing an optical device according to one or more embodiments of the present invention includes, for example: placing, with a rear surface oriented upward, a three-dimensional substrate having a three-dimensional shape, the three-dimensional substrate including: a recessed portion formed on the rear surface, a through-hole penetrating in a plate thickness direction, where one end of the through-hole is formed in a bottom surface of the recessed portion, and four protruding portions having a columnar shape formed on the bottom surface of the recessed portion, where the four protruding portions are formed so as not to come into contact with a side surface of the recessed portion and to cover each of four corners of the through-hole; placing a translucent member inside the recessed portion to cover the through-hole by bringing a first surface of the translucent member into contact with the protruding portion; placing, to cover the recessed portion, an element that is a light receiving element for receiving light or a light emitting element for emitting light on the rear surface of the three-dimensional substrate; and integrating the element and the translucent member with the three-dimensional substrate by filling a sealing resin between the three-dimensional substrate and the element, between a second surface opposed to the first surface of the translucent member and the element, between a side surface adjacent to the first surface and the second surface of the translucent member and the three-dimensional substrate, and between the first surface of the translucent member and the three-dimensional substrate. In this way, it is possible to reliably seal the element and the translucent member in a single step, and thereby reduce the likelihood of defects due to dust. In addition, as there are four protruding portions formed on the bottom surface of the recessed portion not to come into contact with a side surface of the recessed portion and to cover each of the four corners of the through-hole, it is possible to prevent the four corners from being filled with the sealing resin in the sealing resin filling step, such that the optical device can be downsized.

Here, the method of manufacturing the optical device further includes applying, between placing the three-dimensional substrate with the rear surface oriented upward and placing the translucent member inside the recessed portion to cover the through-hole by bringing a first surface of the translucent member into contact with the protruding portion, an adhesive agent to preliminarily fix the translucent member to a location outside the protruding portions in the bottom surface of the recessed portion. In this way, the translucent member may be preliminarily fixed so as not to move when filling the sealing resin, and the translucent member can be positioned in the height direction.

According to one or more embodiments of the present invention, it is possible to provide a compact optical device having a low likelihood of defects due to dust. In addition, it is possible to reliably seal the element and the translucent member in a single step.

DESCRIPTION OF EMBODIMENTS

Below, detailed description of embodiments of the present invention will be given with reference to the drawings. In the present invention, optical device is a general term that includes both light receiving devices and light emitting devices. The optical device may include, for example, a light receiving device having a light receiving element for receiving light, such as a solid state imaging device, a photodiode or the like, and a light emitting device having a light emitting diode for emitting light, such as a laser diode (LD), a surface emitting diode (VCSEL), an LED or the like, for example.

First Embodiment

Figure 1:
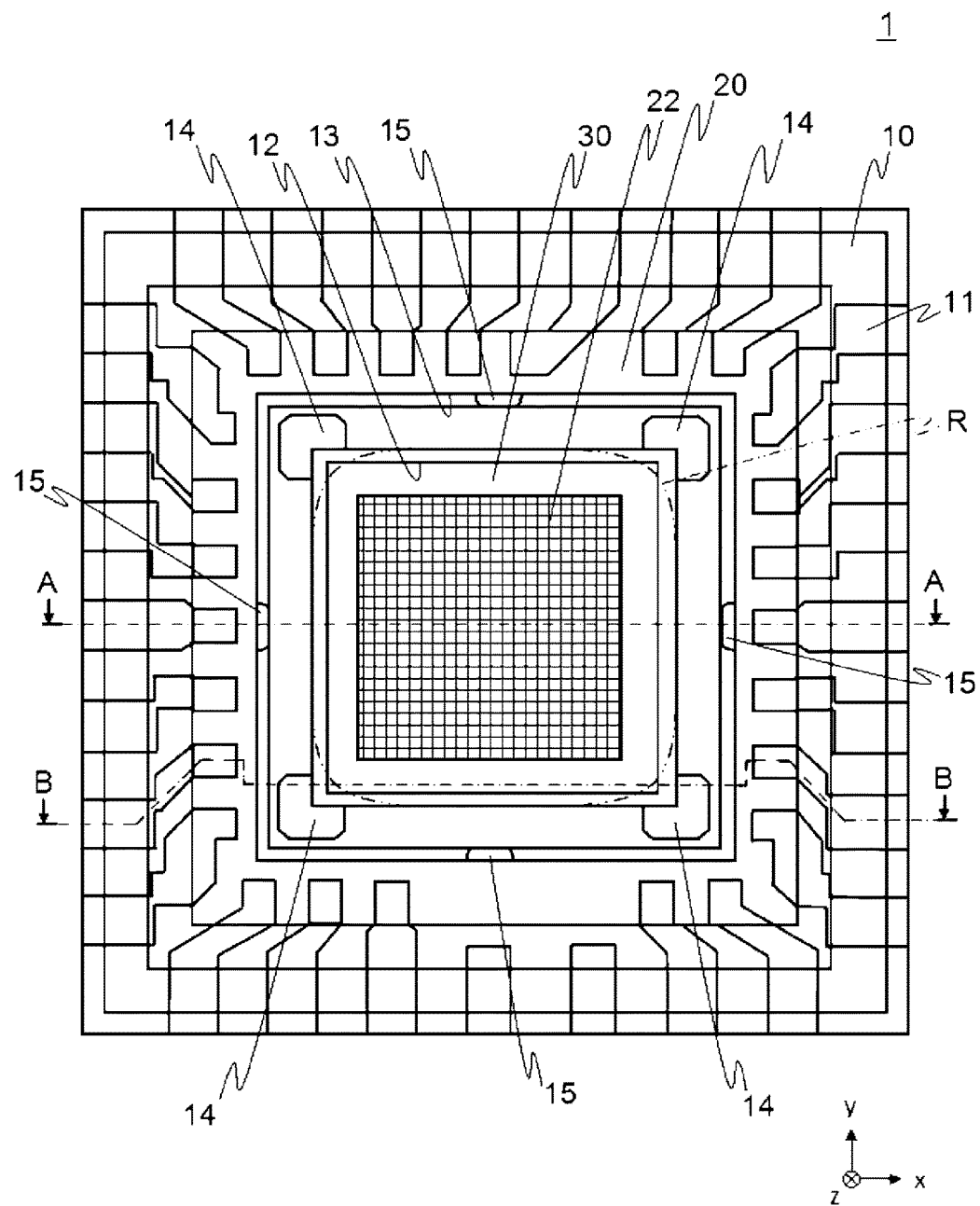
FIG. 1 is a plan view illustrating an outline of a solid state imaging device 1 according to a first embodiment of the present invention.
Figure 2:
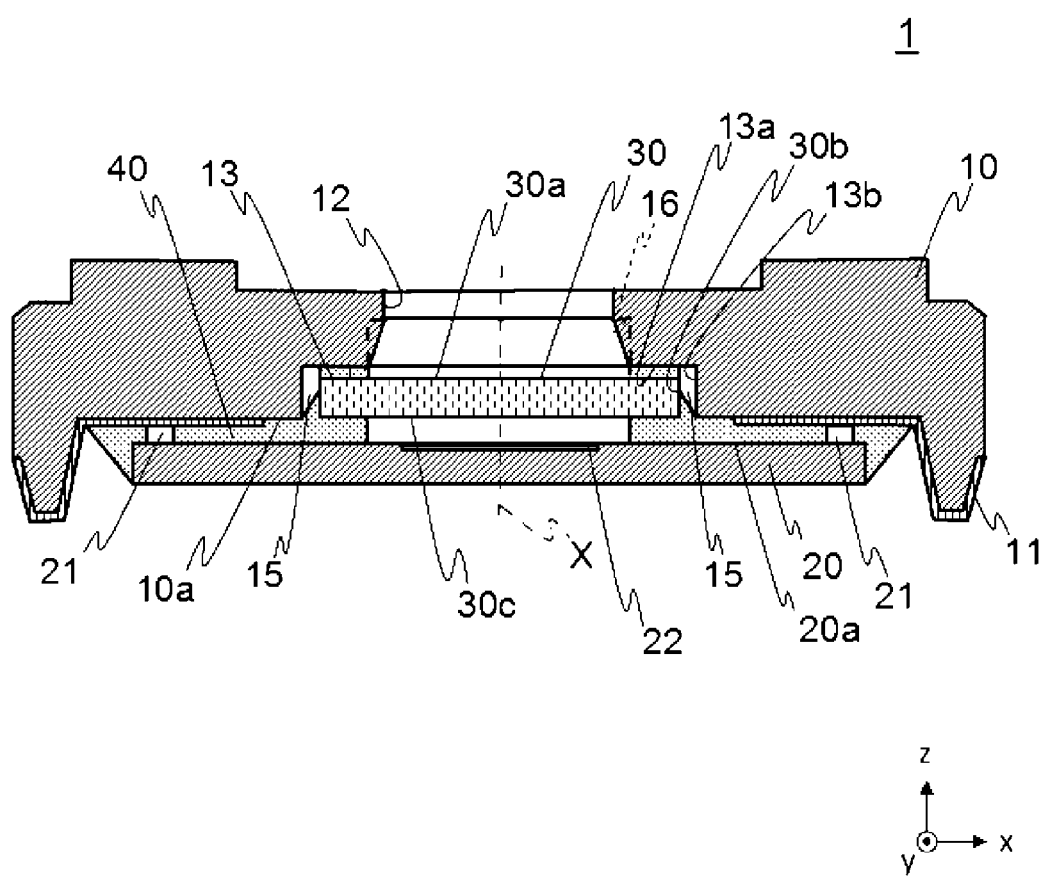
FIG. 2 is a cross-sectional view illustrating an outline of the solid state imaging device 1, and is a cross-sectional view taken along line A-A of FIG. 1.
Figure 3:
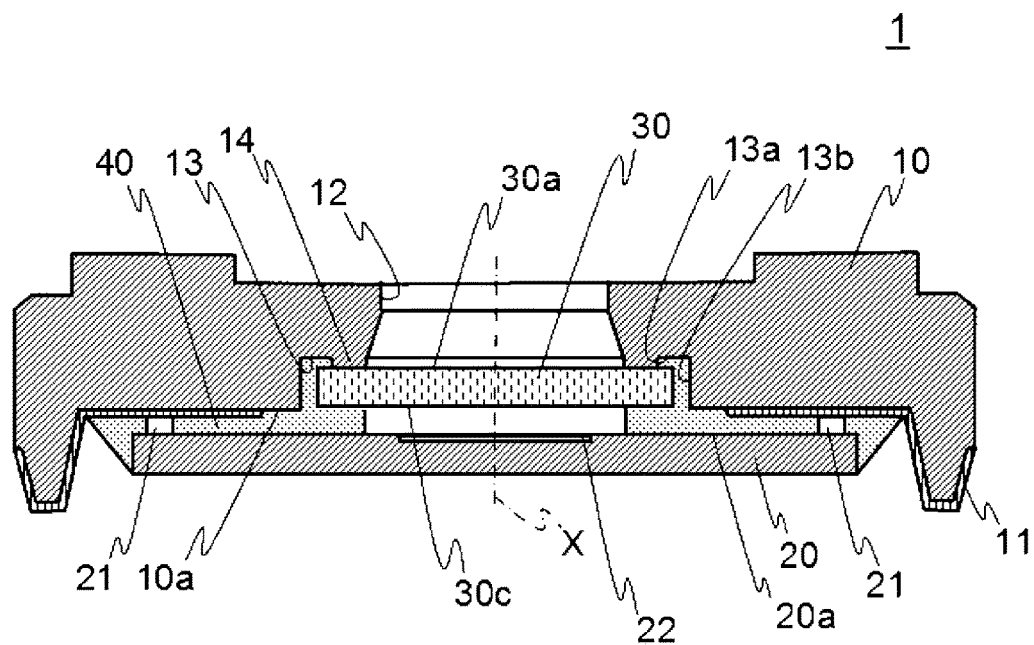
FIG. 3 is a cross-sectional view illustrating an outline of the solid state imaging device 1, and is a cross-sectional view taken along line B-B of FIG. 1.

FIG. 1 is a plan view illustrating an outline of the solid state imaging device 1, which is an example of the present invention. FIG. 2 is a cross-sectional view illustrating an outline of the solid state imaging device 1, and is a cross-sectional view taken along line A-A of FIG. 1. FIG. 3 is a cross-sectional view illustrating an outline of the solid state imaging device 1, and is a cross-sectional view taken along line B-B of FIG. 1. It should be noted that in FIG. 1, the main part is transparent. The solid state imaging device 1 is a light receiving device having a solid state imaging element which is a light receiving element.

The solid state imaging device 1 primarily includes a three-dimensional substrate 10, a solid state imaging element 20, and a translucent member 30. The solid state imaging element 20 and the translucent member 30 are provided on the three-dimensional substrate 10. The imaging region 22 (which will be described in detail later) of the solid state imaging element 20 and the translucent member 30 are arranged with a space (for example, 20 μm to 40 μm) therebetween. It should be noted that the shapes and sizes of the illustrated three-dimensional substrate 10, the solid state imaging element 20, the translucent member 30, and the like are merely examples, and the present invention is not limited thereto.

On the rear side (−z side) of the three-dimensional substrate 10, the solid state imaging element 20 and the translucent member 30 are provided. The three-dimensional substrate 10, the solid state imaging element 20, and the translucent member 30 are integrated with a sealing resin 40 (not illustrated in FIG. 1). In addition, a lens (not illustrated), a holder (not illustrated) that serves as a diaphragm for adjusting the amount of light entering the lens, and the like are provided on the front side (+z side) of the three-dimensional substrate 10. In the present embodiment, a lens (not illustrated), a translucent member 30, and a solid state imaging element 20 are arranged in this order along the optical axis X from the subject side.

The three-dimensional substrate 10 is a wiring substrate having a three-dimensional substrate shape. In the present embodiment, a MID (Molded Interconnect Device) in which a circuit is formed with a metal film on the surface of a resin molded product is used as the three-dimensional substrate 10. PPA (polyphthalamide resin), epoxy resin, ceramic, or the like can be used as the resin molded product of the three-dimensional substrate 10. The three-dimensional substrate 10 is formed to be black in color so as to prevent transmission of light from the outside. As the three-dimensional substrate 10 (MID) is already known, a detailed explanation thereof will be omitted herein. However, the three-dimensional substrate 10 is not limited to a MID, provided it is a substrate having a three-dimensional shape.

The three-dimensional substrate 10 primarily includes a terminal unit 11, a through-hole 12, a recessed portion 13, protruding portions 14, and protruding portions 15.

The terminal unit 11 is provided on the rear surface 10a (not illustrated in FIG. 1) of the three-dimensional substrate 10 for connection with the outside. The terminal unit 11 may be electrically connected to a connection land (not illustrated) formed on a flexible wiring substrate (not illustrated) or the like. In addition, the terminal unit 11 may be electrically connected to a terminal unit (not illustrated) formed in the solid state imaging element 20. Further, the terminal unit 11 may be electrically connected to the main substrate (not illustrated) of various devices such as mobile phones, personal computers, or the like by using a solder paste or the like. Although not illustrated, solder can be used as the method of electrical connection.

In the three-dimensional substrate 10, an opening is formed in the region where the imaging region 22 of the solid state imaging element 20 is arranged. As illustrated in FIG. 2 and FIG. 3, the through-hole 12 that serves as this opening penetrates the three-dimensional substrate 10 in the thickness direction; that is, along the optical axis X (along the z direction). As illustrated in FIG. 1, the through-hole 12 may be formed in a rectangular shape corresponding to the imaging region of the solid-state imaging element 20 in a plan view.

The solid state imaging element 20 may be provided on the rear surface 10a of the three-dimensional substrate 10. In addition, as illustrated in FIG. 2 and FIG. 3, a recessed portion 13 is formed in which the translucent member 30 is provided. One end of the through-hole 12 is formed in the bottom surface 13a of the recessed portion 13.

As illustrated in FIG. 3, the bottom surface 13a of the recessed portion 13 is formed with a protruding portion 14 that comes into contact with the front surface 30a of the translucent member 30. In this way, the three-dimensional substrate 10 and the translucent member 30 are disposed with a predetermined space therebetween.

The protruding portions 14 are columnar members, and are formed in four locations so as not to come into contact with a side surface 13b of the recessed portion 13 and also so as to cover each of the four corners of the through-hole 12 (see FIG. 1). The shape of the protruding portions 14 is a substantially rectangular shape in which a portion overlapping with the through-hole 12 is cut out in a plan view. In this way, by forming the protruding portions 14 near the four corners, as illustrated in FIG. 3, the sealing resin 40 is filled on the front side (+z side) of the translucent member 30 for portions where a protruding portion 14 is not formed.

It should be noted that the shape of the protruding portions 14 is not limited to the illustrated form, as long as it has a columnar shape. For example, the protruding portions 14 may have a substantially circular shape in which a portion overlapping with the through-hole 12 is cut out in a plan view. The height of the protruding portions 14 will be described in detail later.

As illustrated in FIG. 2, protruding portions 15 are formed on the side surfaces 13b of the recessed portion 13 at positions facing each other. The protruding portions 15 abut against the side surfaces 30b of the translucent member 30. Here, the protruding portions 15 are formed at the central portion of each side surface, but the location of the protruding portions 15 is not limited thereto. In addition, the shape of the protruding portions 15 is not limited thereto.

It should be noted that, as illustrated by the dotted line in FIG. 2, a step 16 that serves as an adhesive reservoir may be formed around the periphery of the through-hole 12 of the three-dimensional substrate 10. By providing the step 16, it is possible to prevent the sealing resin 40 from overflowing into the through-hole 12 in the manufacturing process.

The solid state imaging element 20 includes a substantially rectangular imaging region 22 on the front side (+z side) surface (hereinafter, referred to as front surface 20a). The imaging region 22 is a square pixel having a pixel size of 2.25 µm and constituting a Bayer array. A peripheral circuit including an OB (Optical Black) block, an analog-digital conversion circuit, a TG (timing generator), and the like is provided around the imaging region 22. The solid state imaging element 20 may, for example, be a solid state imaging element (CMOS sensor) equipped with a CMOS (complementary metal oxide semiconductor) known as a ¼ inch UXGA type that has approximately 2 million pixels, and may be configured by flip chip mounting of a bare chip by SBB (Stud Bump Bond), ultrasonic bonding, solder bump bonding or the like.

It should be noted that the solid state imaging element 20 is not limited to a CMOS sensor, and may be a CCD sensor or the like. That is, the solid state imaging element 20 may be any device capable of photoelectrically converting the light and dark of received light into an amount of electrical charge and sequentially reading and converting it into an electrical signal.

The solid state imaging element 20 may be connected to the rear surface 10a (or alternatively, the terminal unit 11) of the three-dimensional substrate 10 via the bumps 21 formed on the front surface 20a. The transmission of the video signal obtained by the solid state imaging element 20, the control signal, and the power supply from the outside are performed via the terminal unit 11.

Here, the translucent member 30 is an optical filter, and is formed by applying an IR (InfraRed) cut coat to a glass base material having a thickness of 0.3 mm, for example. The IR cut coat is formed, for example, via a film forming process of vapor depositing a transparent dielectric film such as silicon dioxide ($SiO_2$), titanium oxide ($TiO_2$), magnesium fluoride ($MgF_2$), zirconium oxide ($ZrO_2$) or the like.

The translucent member 30 is a plate-like member, and includes a front surface 30a, a rear surface 30c opposed to the front surface 30a, and four side surfaces 30b adjacent to the front surface 30a and the rear surface 30c. The IR cut coat is applied to the front surface 30a. The translucent member 30 is provided inside the recessed portion 13.

The sealing resin 40 is a photocurable resin such as an epoxy resin, an acrylic resin, a silicone resin, a poly ether resin or the like. Further, the sealing resin 40 may also have thermosetting properties.

In the sealing resin 40, in order to achieve high mold ability, high heat resistance and the like, a filler material may be included in a photocurable resin which is a matrix (base material) resin. Although an inorganic filler material such as silica ($SiO_2$) can be used as the filler material, it is preferable to use an extender pigment. The filler may be a particulate material, and have a diameter of several hundreds of nm to several tens of μm.

Figure 4:
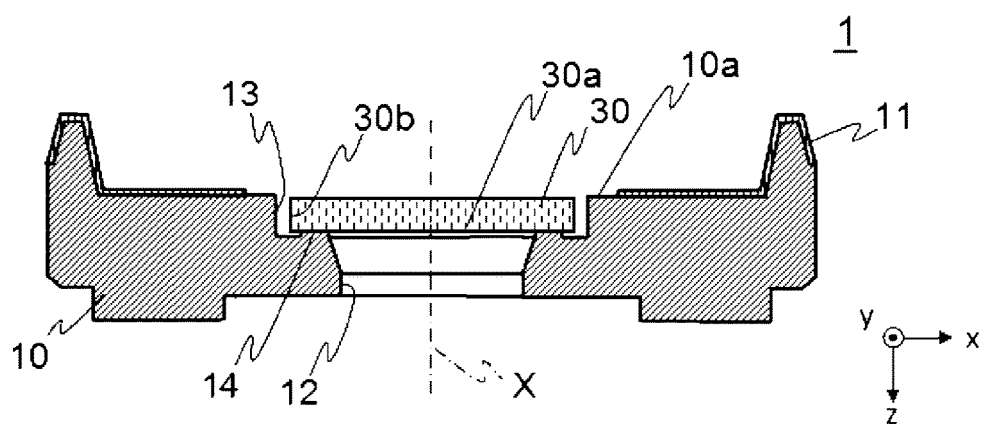
FIG. 4 is a diagram for explaining an assembly process of the solid state imaging device 1.
Figure 5:
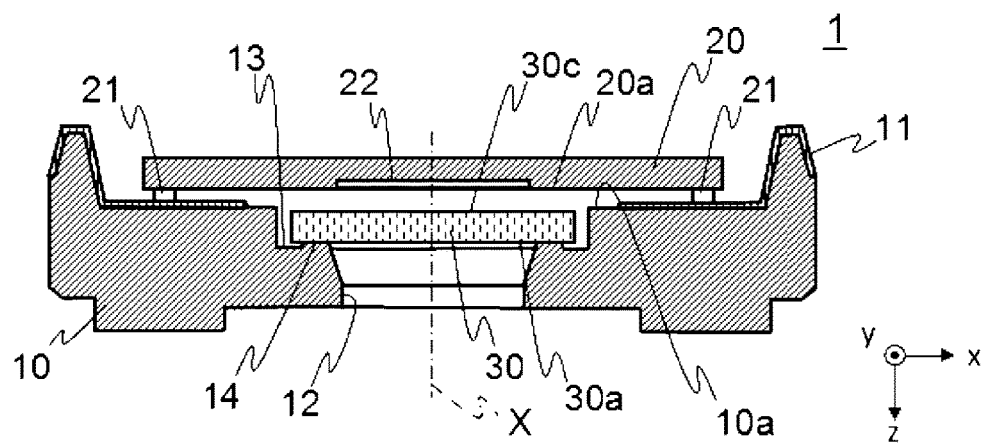
FIG. 5 is a diagram for explaining an assembly process of the solid state imaging device 1.
Figure 6:
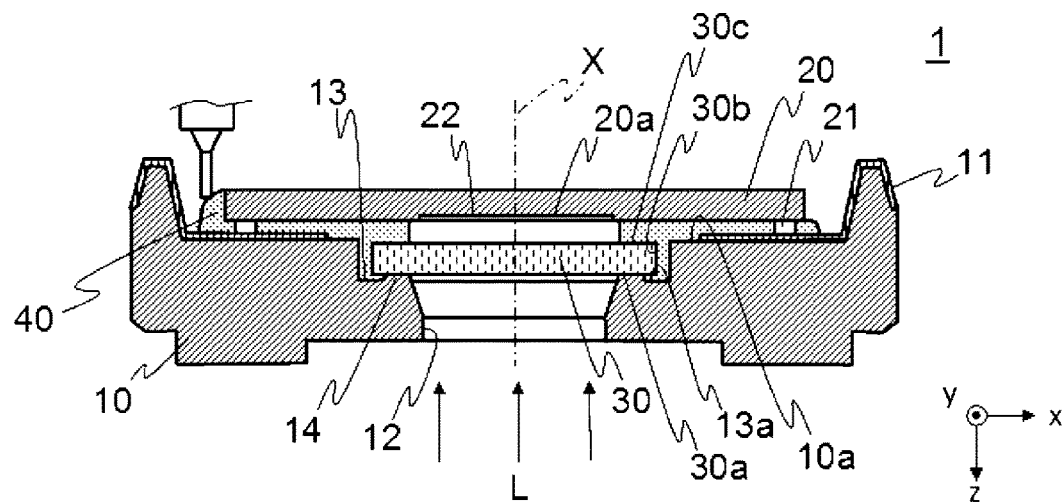
FIG. 6 is a diagram for explaining an assembly process of the solid state imaging device 1.

Next, a method of assembling the solid state imaging device 1 will be described. FIG. 4 to FIG. 6 are diagrams for explaining the assembly process of the solid state imaging device 1.

First, as illustrated in FIG. 4, the three-dimensional substrate 10 is placed with the rear surface 10a oriented upward. Next, the translucent member 30 is placed inside the recessed portion 13. In this step, the translucent member 30 is placed so as to cover the through-hole 12. The front surface 30a of the translucent member 30 is brought into contact with the protruding portion 14, and positioning in the z direction is performed. In addition, the side surface 30b of the translucent member 30 is brought into contact with the protruding portion 15 (not illustrated in FIG. 4; see FIG. 1 and FIG. 2) and positioning in the x direction and the y direction is performed.

Next, as illustrated in FIG. 5, the solid state imaging element 20 is placed on the rear surface 10a (here, the terminal unit 11 provided on the rear surface 10a). In this step, the solid state imaging element 20 is placed so as to cover the recessed portion 13.

Next, as illustrated in FIG. 6, the sealing resin 40 is injected between the three-dimensional substrate 10 and the solid state imaging element 20. In this step, the sealing resin 40 injected between the three-dimensional substrate 10 and the solid state imaging element 20 also flows in between the three-dimensional substrate 10 and the translucent member 30. In particular, in the present embodiment, as the columnar protruding portion 14 is formed on the bottom surface of the recessed portion 13, the sealing resin 40 is filled not only between the side surface 30b of the translucent member 30 and the three-dimensional substrate 10, but also between the front surface 30a of the translucent member 30 and the three-dimensional substrate 10. At the same time, the sealing resin 40 is also filled between the solid state imaging element 20 and the rear surface 30c of the translucent member 30.

The protruding portion 14 is formed at a height which is greater than or equal to twice the maximum particle size of the filler material included in the sealing resin 40. By setting the height of the protruding portion 14, that is, the distance between the bottom surface 13a of the recessed portion 13 and the front surface 30a of the translucent member 30 to be greater than or equal to twice the maximum particle size of the filler material, the speed at which the sealing resin 40 permeates between the three-dimensional substrate 10 and the translucent member 30 increases. In this way, it is possible to improve productivity.

As the sealing resin 40 is injected while irradiating light L from below in FIG. 6 (see the arrow in FIG. 6), the sealing resin 40 is cured around the through-hole 12. Subsequently, the remaining portion of the sealing resin 40 is thermally cured. In this way, the solid state imaging element 20 and the translucent member 30 may be mounted on the three-dimensional substrate 10.

In the present embodiment, as the solid state imaging element 20 and the translucent member 30 are placed from the same direction (the −z direction), it is not necessary to turn over the three-dimensional substrate 10 during the process of attaching the solid state imaging element 20 and the translucent member 30 to the three-dimensional substrate 10. In addition, as the solid state imaging element 20 and the translucent member 30 are integrated with the three-dimensional substrate 10 in a single step, the number of steps can be reduced. Further, it is not necessary to strictly control the amount of the sealing resin 40, such that process management can be simplified.

For example, in cases where an adhesive agent is applied to the recessed portion 13 to adhere the translucent member 30, and then a photo curable sealing resin is filled as in the related art, it is necessary to form an air hole between the translucent member 30 and the three-dimensional substrate 10 for allowing air to escape when filling the photo-curable sealing resin. In contrast, in the present embodiment, as the sealing resin 40 is injected between the solid state imaging element 20 and the three-dimensional substrate 10, between the solid state imaging element 20 and the rear surface 30c of the translucent member 30, between the side surface 30b of the translucent member 30 and the three-dimensional substrate 10, and between the front surface 30a of the translucent member 30 and the three-dimensional substrate 10 while air is released from between the front surface 30a of the translucent member 30 and the three-dimensional substrate 10 in a single process of filling the sealing resin 40, it is not necessary to form an air hole between the front surface 30a of the translucent member 30 and the three-dimensional substrate 10. Accordingly, management of the manufacturing process can be simplified.

In addition, in cases where an adhesive agent is applied to the recessed portion 13 to adhere the translucent member 30, and then a photo curable sealing resin is filled as in the related art, as the adhesive is applied to the entire surface on which the translucent member 30 is mounted, it is difficult to manage the application amount and the application location. Accordingly, there is a problem in which the adhesive agent overflows into the through-hole 12, and the optical path is narrowed. This problem is more likely to occur as the through-hole 12 and the translucent member 30 become smaller. In contrast, in the present embodiment, as the sealing resin 40 is injected while irradiating light L from below (the −z direction), the sealing resin 40 does not overflow into the through-hole 12.

Subsequently, in order to carry out the process of mounting the lens, the three-dimensional substrate 10 is turned over. Then, the lens (not illustrated) and the lens holder (not illustrated) are mounted to the three-dimensional substrate 10 in this order. Finally, an adhesive agent is applied nearby the boundary between the lens holder (not illustrated) and the three-dimensional substrate 10 and the adhesive agent is cured, by which the assembly process of the solid state imaging device 1 is completed.

Next, the operation of the solid state imaging device 1 will be described. Light from a subject passes through the diaphragm (not illustrated), is condensed by a lens (not depicted) and is incident upon the translucent member 30, by which unnecessary infrared light and ultraviolet light are restricted. The light transmitted through the translucent member 30 is incident upon the solid state imaging element 20 and passes through a lens (not displayed) such as a known microlens or what is called an on-chip lens, passes through a pigment-based color filter (not depicted), and is converted into a required electric signal by a photodiode (not illustrated). Then, the electric signal is output as an image signal having, for example, a screen aspect ratio of 4:3 and a frame rate of 15 frames per second, and may be output from the terminal unit 11 to an external monitor or the like.

According to the present embodiment, it is possible to reliably seal the solid state imaging element 20 and the translucent member 30 in a single step. In addition, as the solid state imaging element 20 and the translucent member 30 are integrated with the three-dimensional substrate 10 in a single step, the number of steps can be reduced, productivity can be improved, and process management can be facilitated. In this way, cost reduction is also possible.

In addition, according to the present embodiment, as the protruding portions 14 are formed at four positions so as to cover the four corners of the through-hole 12, the sealing resin 40 does not flow into the four corners of the through-hole 12. Accordingly, the size of the through-hole 12 can be reduced, whereby it is possible to downsize the solid state imaging device 1.

For example, in cases where the protruding portions 14 are not formed, the surface tension of the sealing resin 40 forms a curved surface R at the four corners as indicated by the two-dot chain line in FIG. 1. As light does not enter the portion of the curved surface R, the size of the through-hole 12 needs to be increased by a corresponding amount. In contrast, as the protruding portion 14 covers the four corners, the sealing resin 40 is not filled in the corners, and as a result, the size of the through-hole 12 can be reduced.

Further, by reducing the size, that is, the surface area, of the through-hole 12, the probability of the existence of dust (particles) between the solid state imaging element 20 and the translucent member 30 is reduced. Accordingly, it is possible to reduce the likelihood of defects due to dust in the solid state imaging device 1.

Second Embodiment

In the solid state imaging device 1 according to the first embodiment, although the sealing resin 40 was injected after placing the translucent member 30 and the solid state imaging device 20 on the three-dimensional substrate 10, the translucent member 30 may be preliminarily fixed with an adhesive agent or the like before the sealing resin 40 is injected.

Figure 7:
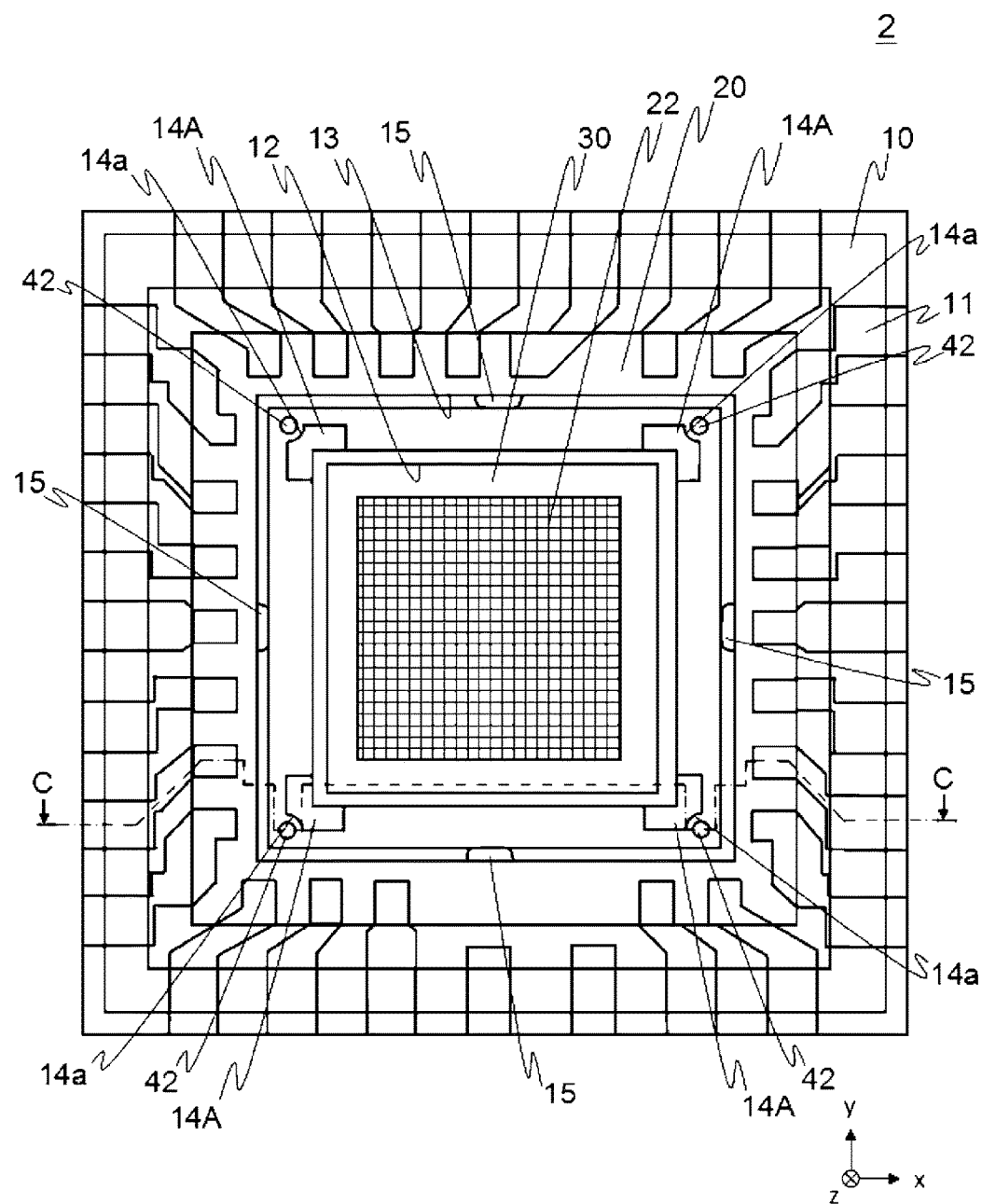
FIG. 7 is a plan view illustrating an outline of a solid state imaging device 2 according to a second embodiment of the present invention.
Figure 8:
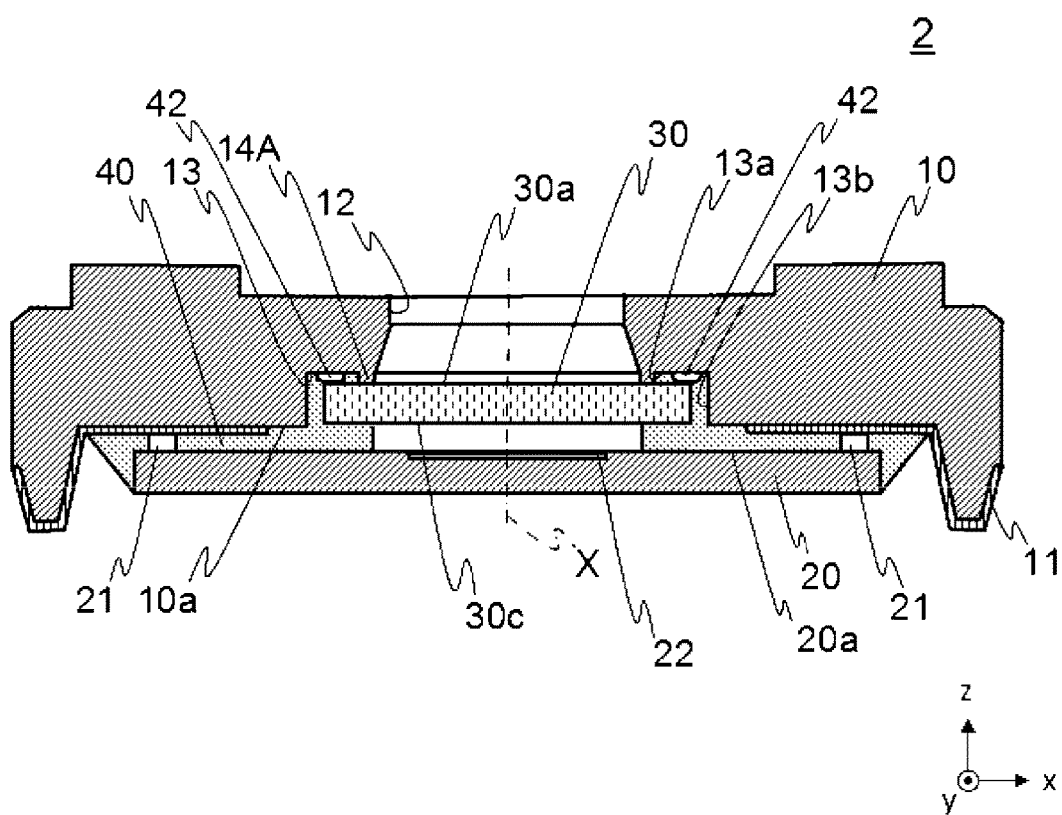
FIG. 8 is a cross-sectional view illustrating an outline of the solid state imaging device 2, and is a cross-sectional view taken along line C-C of FIG. 7.

FIG. 7 is a plan view illustrating an outline of a solid state imaging device 2 according to a second embodiment. FIG. 8 is a cross-sectional view illustrating an outline of the solid state imaging device 2, and is a cross-sectional view taken along line C-C of FIG. 7. The solid state imaging device 2 only differs from the solid state imaging device 1 with respect to the shape of the protruding portions 14 and the presence or absence of the adhesive agent 42. Hereinafter, only the differences between the solid state imaging device 2 and the solid state imaging device 1 will be described.

The protruding portions 14A are formed on the bottom surface 13a of the recessed portion 13. The protruding portions 14A are columnar members, and are formed in four positions so as not to come into contact with a side surface 13b of the recessed portion 13 and so as to cover the four corners of the through-hole 12, respectively. In the protruding portions 14A, in a plan view, a portion overlapping with the through-hole 12 is cut out in the protruding portions 14A, and a region including a location farthest from the center of the solid state imaging device 2 is cut out in an arc-shape. This arc-shaped notch 14a protrudes toward the center of the solid state imaging device 2. On the bottom surface 13a, an adhesive agent 42 for preliminarily attaching the translucent member 30 is applied in a dot shape to the outside (the side away from the center of the solid state imaging device 2) of the notch 14a. The adhesive agent 42 is applied to a position that does not contact the protruding portions 14A or the recessed portion 13.

It should be noted that the shape of the protruding portions 14A is not limited to this, and the notch 13a is not strictly necessary. For example, in a case where a protruding portion having a narrow L-shape is provided, the notch 14a becomes unnecessary.

Next, a method of assembling the solid state imaging device 2 will be described. First, the three-dimensional substrate 10 is placed with the rear surface 10a oriented upward. Next, the adhesive agent 42 is applied in a dot-shape to a location on the bottom surface 13a outside the notch 14a, after which the translucent member 30 is placed thereon. When the translucent member 30 is placed so as to be in contact with the protruding portions 14A, the adhesive agent 42 adheres to the translucent member 30, and the translucent member 30 is preliminarily fixed.

Next, the solid state imaging element 20 is placed on the rear surface 10a, and thereafter the sealing resin 40 is injected between the three-dimensional substrate 10 and the solid state imaging element 20. Enclosure of the sealing resin 40 is performed after the adhesive agent 42 has hardened. In the present embodiment, as the notch 14a is formed in the protruding portion 14A, when the adhesive agent 42 is applied in a dot shape to a location outside the notch 14a, the adhesive agent 42 does not come into contact with the protruding portions 14A or the recessed portion 13. Accordingly, defects do not arise in filling of the sealing resin 40.

When the sealing resin 40 is enclosed, as the translucent member 30 is preliminarily fixed by the adhesive agent 42, even when the sealing resin 40 is injected, the position of the translucent member 30 in the z direction does not change. Accordingly, the translucent member 30 may be accurately positioned in the height direction.

It should be noted that, as the adhesive agent 42 is applied to the outside of the protruding portions 14A, even in a case where the application amount of the adhesive agent 42 is excessive, the adhesive agent 42 does not overflow into the through-hole 12. In addition, as the adhesive agent 42 does not contact the protruding portions 14A or the recessed portion 13, the sealing resin 40 is filled on the front side (+z side) of the translucent member 30, as in the solid state imaging device 1. As the remainder of the assembly process of the solid state imaging device 2 is the same as that of the solid state imaging device 1, the description thereof will be omitted herein.

It should be noted that, although the adhesive agent 42 was applied to four locations in the present modified example, it is sufficient to apply the adhesive agent 42 to at least three places in order to position the translucent member 30 in the height direction. In addition, the application location of the adhesive agent 42 is not limited to the illustrated location. However, it is preferable that the adhesive agent 42 is applied to the outside of the protruding portions 14A.

Third Embodiment

Although the plate-shaped translucent member 30 was provided on the rear surface side of the three-dimensional substrate 10 in the solid state imaging device 3 according to the first embodiment, a plurality of translucent members may be provided on the rear surface side of the three-dimensional substrate.

Figure 9:
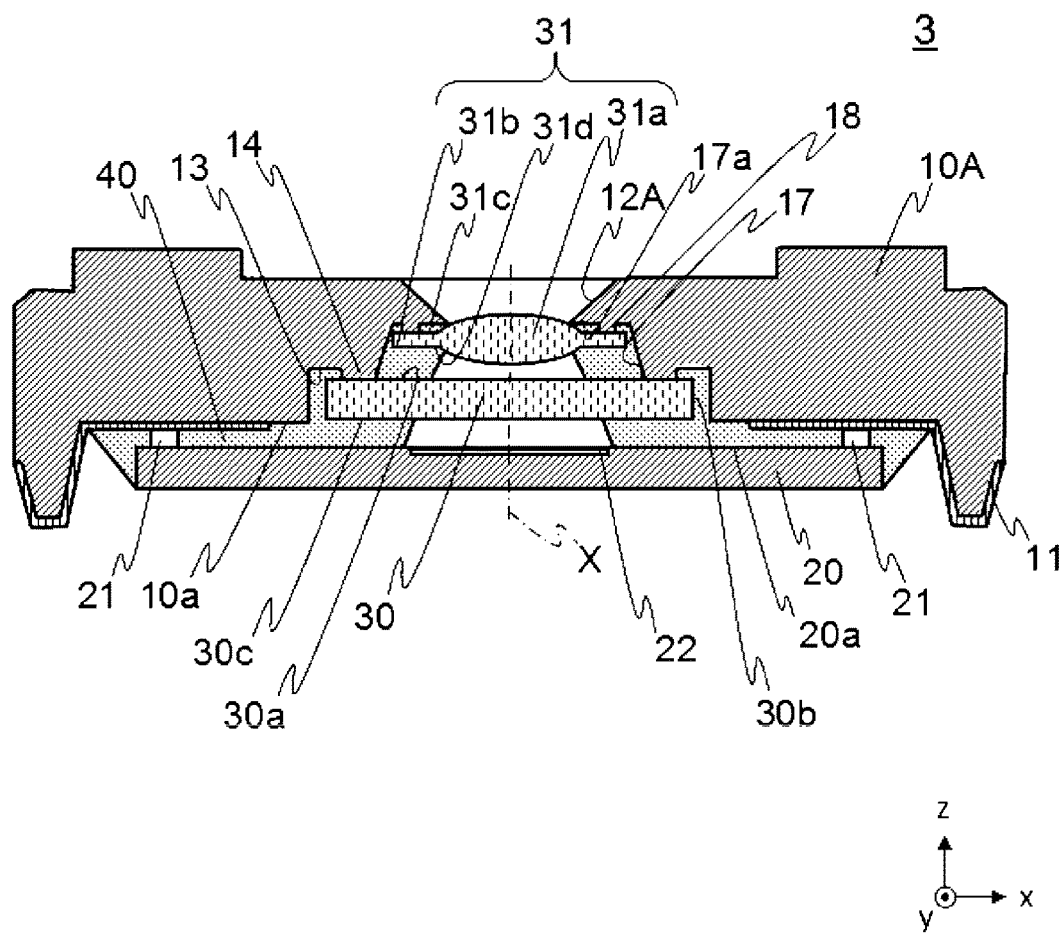
FIG. 9 is a cross-sectional view illustrating an outline of a solid state imaging device 3 according to a third embodiment of the present invention.

FIG. 9 is a cross-sectional view illustrating an outline of a solid state imaging device 3 according to a third embodiment. The solid state imaging device 3 differs from the solid state imaging device 1 with respect to the presence or absence of the lens 31 and the shape of the three-dimensional substrate. Hereinafter, only the differences between the solid state imaging device 3 and the solid state imaging device 1 will be described.

The three-dimensional substrate 10A primarily includes a terminal unit 11, a through-hole 12A, a recessed portion 13, a protruding portion 14, a protruding portion 15 (not illustrated in FIG. 9), a recessed portion 17, and a protruding portion 18. The recessed portion 17 is formed on the bottom surface of the recessed portion 13. One end of the through-hole 12A is formed in the bottom surface 17a of the recessed portion 17. Also, a protruding portion 18 with which the surface of the lens 31 abuts is formed on the bottom surface 17a of the recessed portion 17.

Similar to the translucent member, the lens 31 is also a translucent member, and includes a lens portion (for example, a fixed-focus type lens) 31a formed at a central portion of a plate-shaped member and a plate portion 31b at a peripheral edge of the lens portion 31a. The plate portion 31b abuts against the protruding portion 18 such that the lens portion 31a covers the through-hole 12A.

It should be noted that, in the present embodiment, although the +z side from the bottom surface 17a of the through-hole 12A has a substantially truncated pyramidal shape with a wide tip, the shape of the through-hole 12A is not limited thereto. However, in order to collect more light to the lens 31, it is desirable that the through-hole 12A has a substantially truncated pyramidal shape with a wide tip.

Next, a method of assembling the solid state imaging device 3 will be described. The three-dimensional substrate 10A is placed with the rear surface 10a oriented upward, and the lens 31, the translucent member 30, and the solid state imaging element 20 are sequentially placed thereon.

Next, the sealing resin 40 is injected between the three-dimensional substrate 10A and the solid state imaging element 20 while irradiating light from the +z direction. In this process, the sealing resin 40 also flows between the three-dimensional substrate 10A and the translucent member 30, and also between the three-dimensional substrate 10A and the lens 31. In particular, in the present embodiment, the sealing resin 40 is filled between the three-dimensional substrate 10A and the solid state imaging element 20, between the rear surface 30c of the translucent member 30 and the solid state imaging element 20, between the side surface 30b of the translucent member 30 and the three-dimensional substrate 10A, between the front surface 30a of the translucent member 30 and the three-dimensional substrate 10A, between the rear surface 31d of the lens 31 and the front surface 30a of the translucent member 30, between the side surface of the plate portion 31b of the lens 31 and the three-dimensional substrate 10A, and between the front surface 31c of the lens 31 and the three-dimensional substrate 10A.

As light is irradiated, the sealing resin 40 is cured around the through-hole 12A. As the through-hole 12A has a substantially truncated pyramidal shape, the sealing resin 40 is cured in a state (substantially truncated pyramidal shape) that spreads out as it extends in the −z direction.

Thereafter, the remaining portion of the sealing resin 40 is thermally cured. In this way, the solid state imaging element 20, the translucent member 30, and the lens 31 are attached to the three-dimensional substrate 10A.

According to the present embodiment, it is possible to simultaneously attach a plurality of translucent members (here, the translucent member 30 and the lens 31) and the solid state imaging element 20 to the three-dimensional substrate 10A.

Fourth Embodiment

Although a solid state imaging element 20 that is a light receiving element is used in the light emitting device 4 according to the first embodiment, a light emitting element may be used in place of the solid state imaging element 20.

Figure 10:
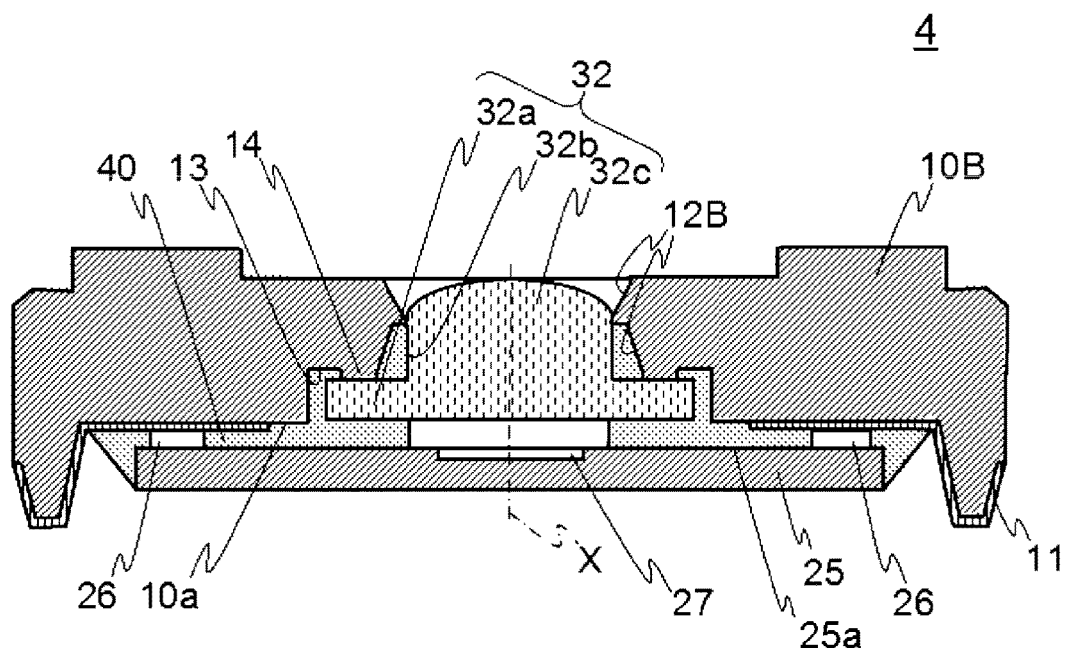
FIG. 10 is a cross-sectional view illustrating an outline of a light emitting device 4 according to a fourth embodiment of the present invention.
Figure 10:
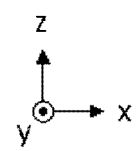

FIG. 10 is a cross-sectional view illustrating an outline of a light emitting device 4 according to a fourth embodiment. The light emitting device 4 differs from the solid state imaging device 1 with respect to the difference in the elements, the shape of the three-dimensional substrate, and the shape of the translucent member. Hereinafter, only the differences between the light emitting device 4 and the solid state imaging device 1 will be described.

The three-dimensional substrate 10B primarily includes a terminal unit 11, a through-hole 12B, a recessed portion 13, a protruding portion 14, and a protruding portion 15 (not illustrated in FIG. 10). One end of the through-hole 12B is formed in the bottom surface 13a of the recessed portion 13.

A light emitting element 25 is provided on the rear surface 10a of the three-dimensional substrate 10B. The light emitting element 25 has a substantially rectangular light emitting region 27 on a front side (+z side) surface (hereinafter, referred to as front surface 25a). Electronic elements for emitting light such as a laser diode (LD), a surface emitting diode (VCSEL), and an LED may be formed in the light emitting region 27. The light emitting element 25 is connected to the rear surface 10a (or alternatively the terminal unit 11) of the three-dimensional substrate 10B via bumps 26 formed on the front surface 25a.

The translucent member 32 is a plate-shaped member formed of a glass substrate, for example, and has a plate-shaped portion 32a, a cylindrical portion 32b, and a lens portion 32c. The IR cut coat may be applied to the surface of the lens portion 32c. The plate-shaped portion 32a may be provided inside the recessed portion 13 so as to cover the through-hole 12B. The plate-shaped portion 32a may come into contact with the protruding portion 14. In addition, the side surface of the cylindrical portion 32b may be in contact with the through-hole 12B.

Next, the method of assembling the light emitting device 4 will be described. The three-dimensional substrate 10B is placed with the rear surface 10a oriented upward, and the translucent member 32 and the light emitting element 25 are sequentially placed thereon.

Next, the sealing resin 40 is injected between the three-dimensional substrate 10B and the light emitting element 25 while irradiating light from the +z direction. In this process, the sealing resin 40 also flows between the three-dimensional substrate 10B and the translucent member 30, and also between the three-dimensional substrate 10B and the translucent member 32. As light is irradiated, the sealing resin 40 is cured at the position of the outer peripheral surface of the cylindrical portion 32b.

Subsequently, the remaining portion of the sealing resin 40 is thermally cured. In this way, the light emitting element 25 and the translucent member 32 may be mounted on the three-dimensional substrate 10B. In this way, the present invention is not limited to a light receiving device having a light receiving element, but can also be applied to light emitting device having light emitting elements.

Fifth Embodiment

In the fifth embodiment of the present invention, the rear surface of the solid state imaging element 20 is shielded from light by using a sealing resin. Hereinafter, a solid state imaging device 5 according to the fifth embodiment will be described. Note that the same components as those in the first embodiment are denoted by the same reference numerals, and descriptions thereof will be omitted.

Figure 11:
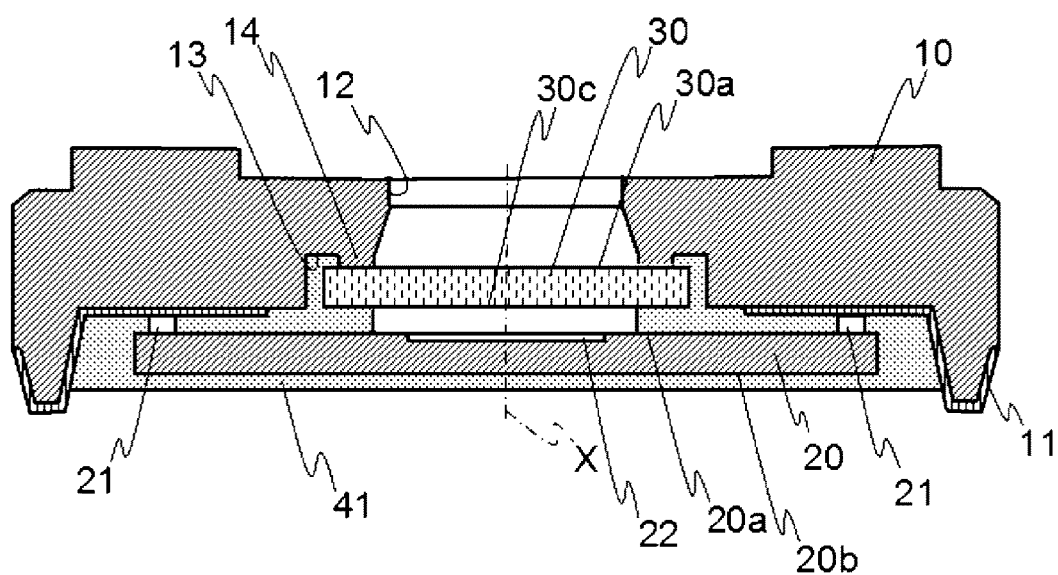
FIG. 11 is a cross-sectional view illustrating an outline of a solid state imaging device 5 according to a fifth embodiment of the present invention.
Figure 11:
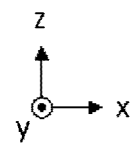

FIG. 11 is a cross-sectional view illustrating an outline of a solid state imaging device 5. The light emitting device 4 primarily includes a three-dimensional substrate 10, a solid state imaging element 20, and a translucent member 30. The three-dimensional substrate 10, the solid state imaging element 20, and the translucent member 30 are integrated with a light-shielding resin 41.

The light-shielding resin 41 is obtained by coloring the sealing resin 40, which is a photocurable and thermosetting resin, to be a dark color such as black, dark gray, brown, blackish brown, or the like. In the present embodiment, by adding carbon powder to the sealing resin 40, the sealing resin 40 is colored black to form the light-shielding resin 41. In this way, light shielding properties can be given to the light-shielding resin 41.

It should be noted that, in order to achieve both photocurability and light shielding performance, it is preferable that the content of the carbon powder relative to the total solid components of the light-shielding resin 41 be less than or equal to 1% (preferably less than or equal to 0.5%). In this case, in order to obtain the light shielding effect, it is preferable that the thickness of the light-shielding resin 41 in the portion covering the solid state imaging element 20 be approximately 100 μm.

In the process of injecting the light-shielding resin 41 between the three-dimensional substrate 10 and the solid state imaging element 20 (see FIG. 6), in addition to injecting the light-shielding resin 41 between the three-dimensional substrate 10 and the solid state imaging element 20, between the three-dimensional substrate 10 and the translucent member 30, and between the solid state imaging element 20 and the translucent member 30, the light-shielding resin 41 is applied so as to cover the solid state imaging element 20. In this way, the entire rear surface 20b of the solid state imaging element 20 is covered with the light-shielding resin 41.

Accordingly, it is possible to integrate the solid state imaging element 20 and the translucent member 30 with the three-dimensional substrate 10 in a single step, as well as to prevent light from entering the solid state imaging element 20 from the rear surface 20b of the solid state imaging element 20.

Sixth Embodiment

The sixth embodiment of the present invention is an embodiment in which a ground electrode is provided on the rear surface 20b of the solid state imaging element 20. Hereinafter, a solid state imaging device 6 according to the sixth embodiment will be described. Note that the same components as those in the first embodiment are denoted by the same reference numerals, and descriptions thereof will be omitted.

Figure 12:
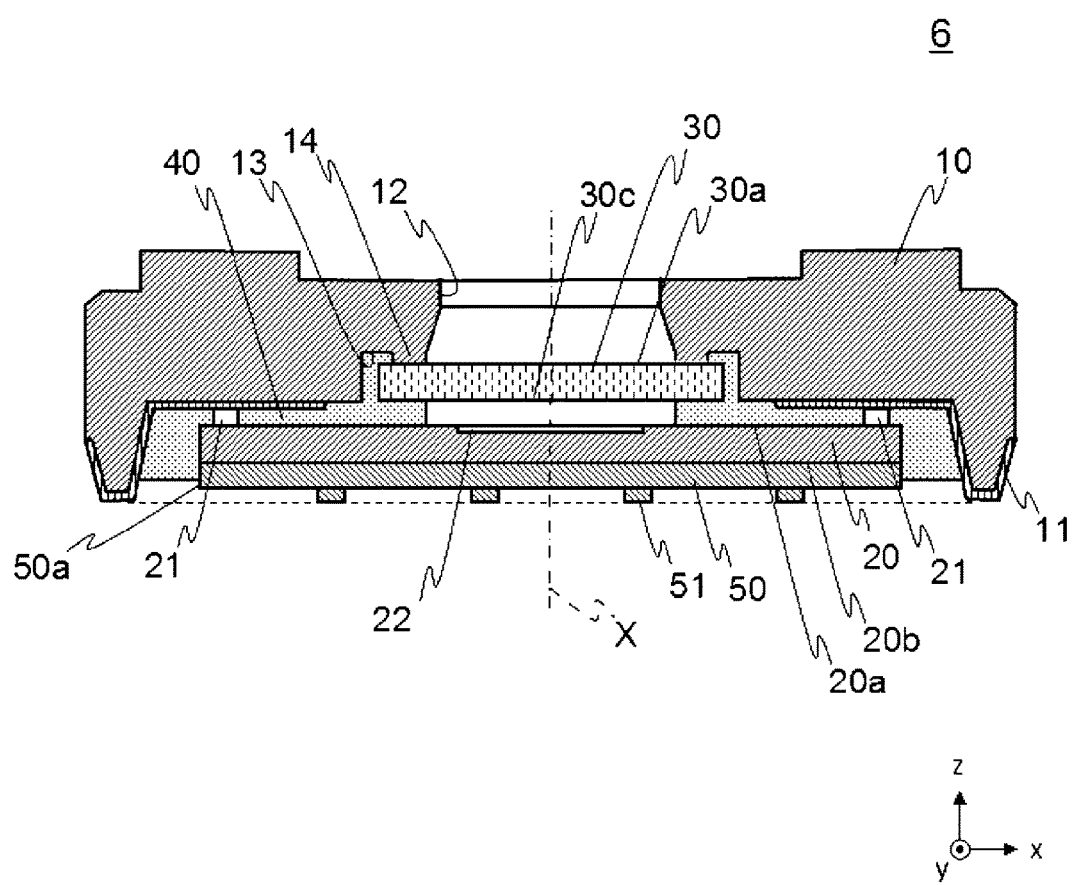
FIG. 12 is a cross-sectional view illustrating an outline of a solid state imaging device 6 according to a sixth embodiment of the present invention.

FIG. 12 is a cross-sectional view illustrating an outline of the solid state imaging device 6. The solid state imaging device 6 primarily includes a three-dimensional substrate 10, a solid state imaging element 20, a translucent member 30, and a ground electrode 50. The three-dimensional substrate 10, the solid state imaging element 20, the translucent member 30, and the ground electrode 50 are integrated with the sealing resin 40.

The ground electrode 50 may be made of a material having a high thermal conductivity, such as a metal, for example. The ground electrode 50 is a plate-shaped member, and is provided so as to be in contact with the rear surface 20b of the solid state imaging element 20.

It should be noted that, in the present embodiment, although the ground electrode 50 covers the entire rear surface 20b, the size of the ground electrode 50 is not limited thereto. For example, the ground electrode 50 may be formed to have a size that covers only a part of the rear surface 20b of the solid state imaging element 20. However, in order to increase the heat removal effect (to be described in detail later), it is preferable that the ground electrode 50 cover the entire rear surface 20b.

A plurality of protruding portions 51 are formed on the ground electrode 50. The protruding portions 51 are formed such that the height of the tips (location in the z direction) are substantially the same as the height of the terminal unit 11 provided on the protruding portion formed on the peripheral edge of the rear surface 10a of the three-dimensional substrate 10 (see the dotted line in FIG. 12.).

It should be noted that, although the protruding portions 51 have a substantially rectangular cross section in FIG. 12, the shape of the protruding portions 51 is not limited thereto. For example, the protruding portions 51 may have a substantially hemispherical cross section. In addition, the protruding portions 51 may have a columnar shape or a rib shape.

Next, a method of assembling the solid state imaging device 6 will be described. First, the step of placing the three-dimensional substrate 10, the step of placing the translucent member 30 in the recessed portion 13 (see FIG. 4), and the step of placing the solid state imaging element 20 on the rear surface 10a (see FIG. 5) are performed.

Next, a step is performed of placing the surface of the ground electrode 50 on which the protruding portions 51 are not formed on the rear surface 20b of the solid state imaging element 20. In this state, a step is performed of injecting the sealing resin 40 between the three-dimensional substrate 10 and the solid state imaging element 20 while irradiating light L from below.

At this time, the sealing resin 40 is injected so as to cover the side surface 50a of the ground electrode 50. The sealing resin 40 integrates the ground electrode 50 and the solid state imaging element 20, as well as the ground electrode 50 and the three-dimensional substrate 10. In this way, the solid state imaging element 20 and the translucent member 30 can be provided on the three-dimensional substrate 10 and the ground electrode 50 can be provided on the solid state imaging element 20 in a single step.

Figure 13:
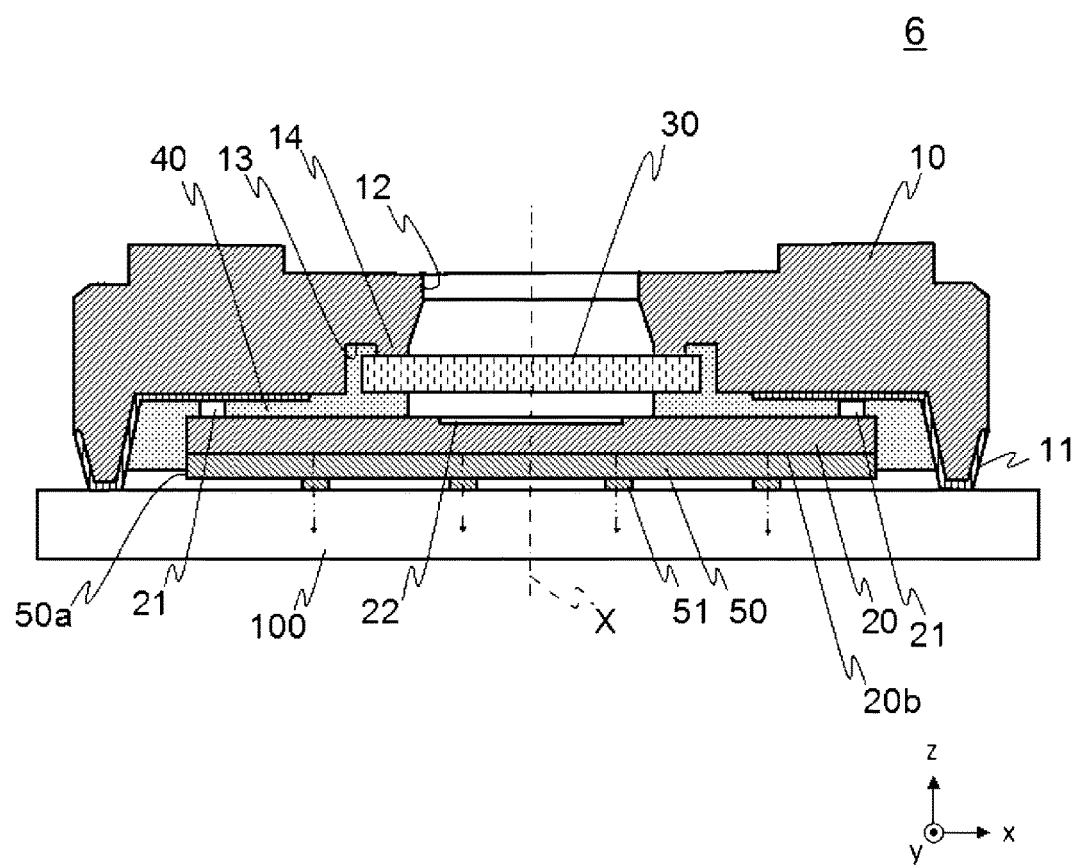
FIG. 13 is a diagram illustrating a state (usage state) in which the solid state imaging device 6 is placed on the substrate 100.

FIG. 13 is a diagram illustrating a state (usage state) in which the solid state imaging device 6 is placed on the substrate 100. A portion of the terminal unit 11 provided on the protruding portion in the vicinity of the peripheral edge of the rear surface 10a comes into contact with the substrate 100. In addition, the tip of the protruding portions 51 is also in contact with the substrate 100.

By forming a ground pattern with metal at a position where the tip of the protruding portions 51 of the substrate 100 abuts, it is possible to electrically connect the solid state imaging element 20 and the ground pattern without forming separate wirings. In addition, as the heat of the solid state imaging element 20 is transmitted to the substrate 100 through the ground electrode 50 and the ground pattern on the substrate 100 (see the two-dot chain line arrow in FIG. 13), the temperature increase of the solid state imaging element 20 can be suppressed.

Also, by providing the ground electrode 50 on the rear surface 20b of the solid state imaging element 20, it is possible to prevent light from entering the solid state imaging element 20 from the rear surface of the solid state imaging element 20.

Seventh Embodiment

The seventh embodiment of the present invention is an embodiment in which a flexible substrate is integrated with a solid state imaging device. Hereinafter, a solid state imaging device 7 according to the seventh embodiment will be described. Note that the same components as those in the first embodiment are denoted by the same reference numerals, and descriptions thereof will be omitted.

Figure 14:
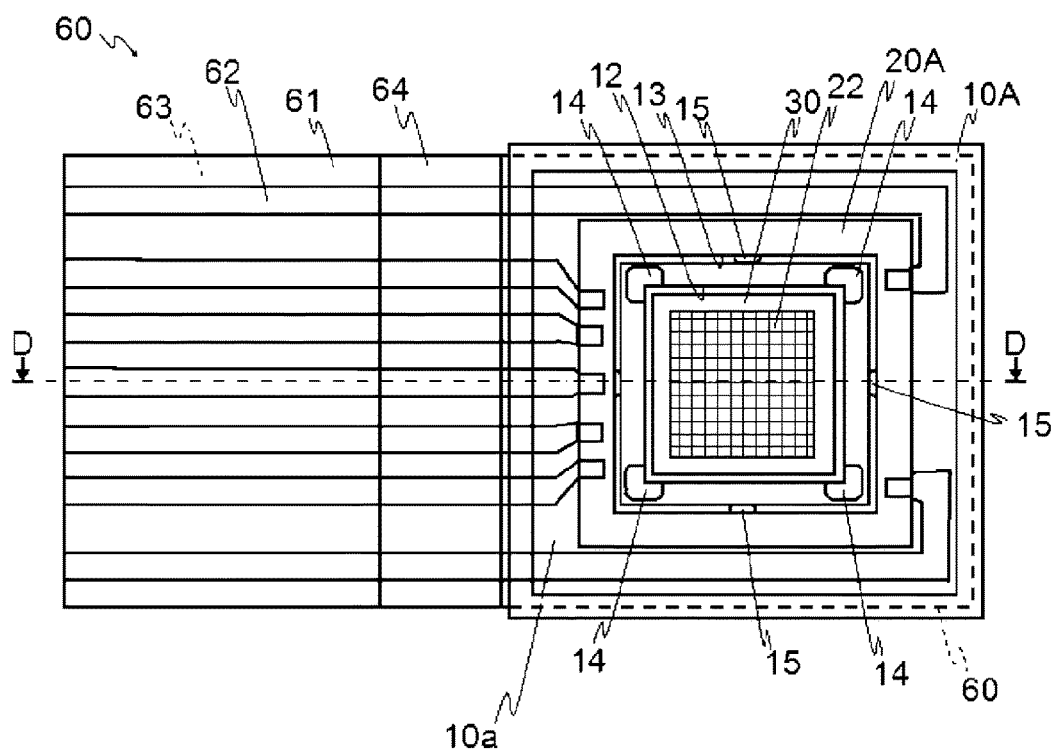
FIG. 14 is a plan view illustrating an outline of a solid state imaging device 7.
Figure 15:
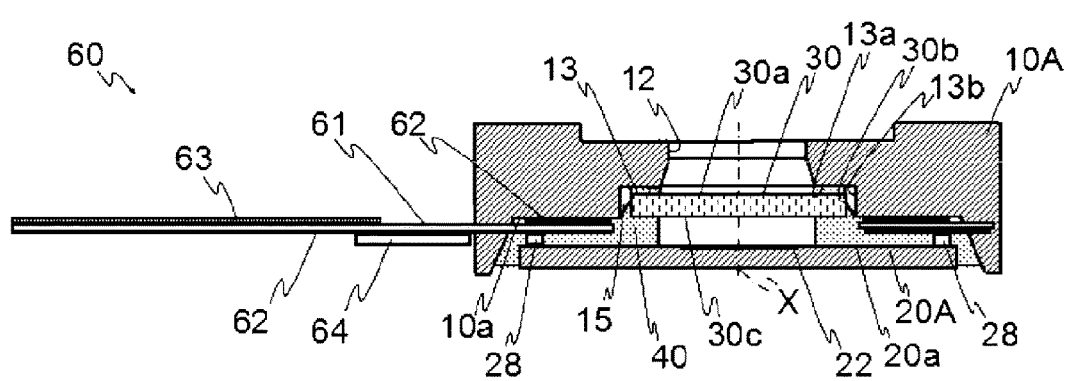
FIG. 15 is a cross-sectional view illustrating an outline of the solid state imaging device 7, and is a cross-sectional view taken along line D-D of FIG. 14.
Figure 15:
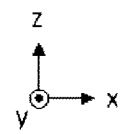

FIG. 14 is a plan view illustrating an outline of a solid state imaging device 7. FIG. 15 is a cross-sectional view illustrating an outline of the solid state imaging device 7, and is a cross-sectional view taken along line D-D of FIG. 14. It should be noted that in FIG. 14, the main part is transparent.

The solid state imaging device 7 primarily includes a three-dimensional substrate 10A, a solid state imaging device 20A, a translucent member 30, and a flexible substrate 60. As the only difference between the three-dimensional substrate 10A and the three-dimensional substrate 10B is the shape, a detailed description of the three-dimensional substrate 10A is omitted herein. In addition, as the only difference between the solid state imaging element 20 and the solid state imaging element 20A is only the material of the bumps (described in detail layer), a detailed description of the solid state imaging element 20A will be omitted herein.

The flexible substrate 60 is a flexible printed circuit board. On the flexible substrate 60, a circuit pattern is formed from a metal foil 62 formed of a conductive material such as copper on a substantially rectangular film-like (a thin film of from 12 μm to 50 μm) substrate 61 made of an insulating material (such as plastic, for example). In addition, an insulator 63 is covered on the metal foil 62 with the exception of the terminal unit and the solder portion. Further, with respect to the portions adjacent to the three-dimensional substrate 10A, a plate material 64 is provided for reinforcement.

The flexible substrate 60 is integrated with the three-dimensional substrate 10A in advance. The flexible substrate 60 is disposed on the rear surface 10a of the three-dimensional substrate 10A. When the solid state imaging element 20A is provided on the three-dimensional substrate 10A, the flexible substrate 60 is sandwiched between the solid state imaging element 20A and the three-dimensional substrate 10A.

In addition, when the solid state imaging element 20 is provided on the three-dimensional substrate 10A, the bumps 28 (see FIG. 15) come into contact with the metal foil 62, and the bumps 28 (that is, the solid state imaging element 20) and the metal foil 62 (that is, the flexible substrate 60) are electrically connected. It should be noted that the bumps 28 are protruding portions formed on the surface 20a, and are formed of a conductive material. The transmission of the video signal obtained by the solid state imaging element 20, the control signal, and the power supply from the outside are performed via the flexible substrate 60.

Next, a method of assembling the solid state imaging device 7 will be described. First, a three-dimensional substrate 10A with which the flexible substrate 60 has been integrated in advance is placed with the rear surface 10a oriented upward. Next, the translucent member 30 is placed inside the recessed portion 13.

Next, the solid state imaging element 20A is placed on the flexible substrate 60 provided on the rear surface 10a. In this step, the solid state imaging element 20A is placed so as to cover the recessed portion 13. In addition, the bumps 28 are placed on the metal foil 62.

Subsequently, the sealing resin 40 is injected between the three-dimensional substrate 10A and the solid state imaging element 20A. In this step, the sealing resin 40 is filled between the three-dimensional substrate 10A and the solid state imaging element 20A, between the solid state imaging element 20A and the translucent member 30, between the three-dimensional substrate 10A and the translucent member 30, and between the flexible substrate 60 and the solid state imaging element 20A. In this way, the solid state imaging element 20A and the translucent member 30 are mounted on the three-dimensional substrate 10A on which the flexible substrate 60 is provided.

According to the present embodiment, it is possible to manufacture a solid state imaging device 7 in which a flexible substrate 60 is integrated in fewer steps.

In addition, according to the present embodiment, as it is unnecessary to provide separate substrates or wiring on the three-dimensional substrate 10A, devices manufactured using the solid state imaging device 7 can be miniaturized. Accordingly, the solid state imaging device 7 is particularly effective when it is applied to a device that needs to be miniaturized, such as an endoscope.

Eighth Embodiment

The eight embodiment of the present invention is an embodiment including two solid state imaging elements 20 and two translucent members 30. Hereinafter, the solid state imaging device 8 according to the eighth embodiment will be described. Note that the same components as those in the first embodiment are denoted by the same reference numerals, and descriptions thereof will be omitted.

Figure 16:
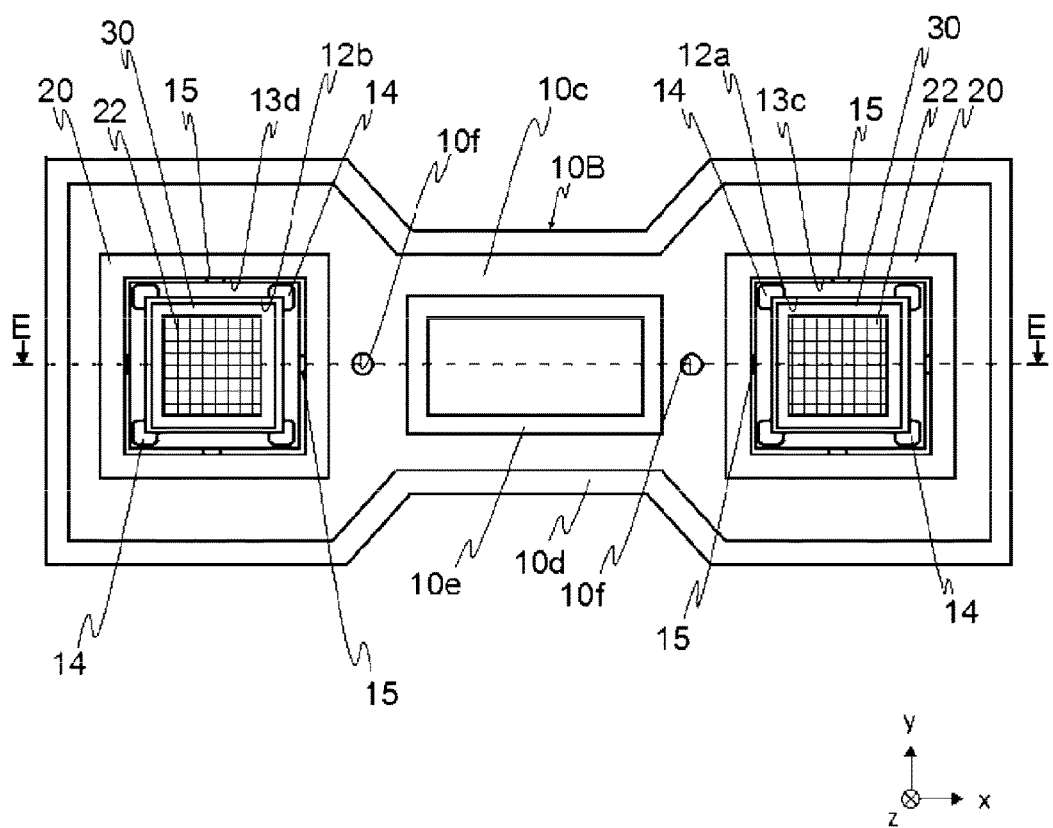
FIG. 16 is a plan view illustrating an outline of a solid state imaging device 8.
Figure 17:
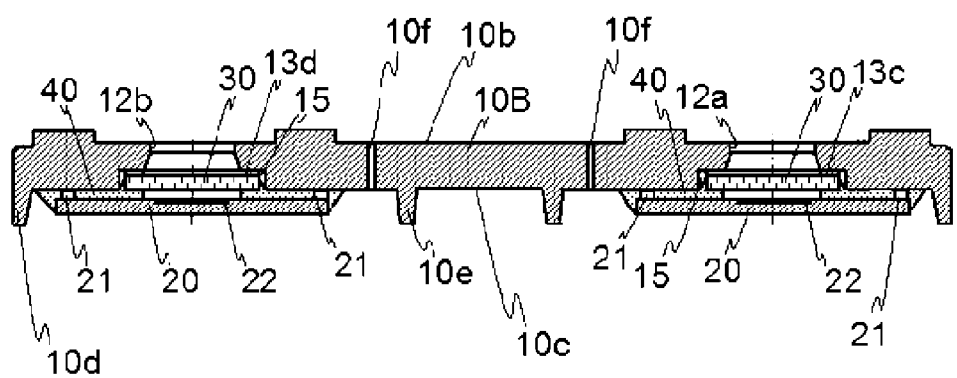
FIG. 17 is a cross-sectional view illustrating an outline of the solid state imaging device 8, and is a cross-sectional view taken along line E-E in FIG. 16.

FIG. 16 is a plan view illustrating an outline of a solid state imaging device 8. FIG. 17 is a cross-sectional view illustrating an outline of the solid state imaging device 8, and is a cross-sectional view taken along line E-E in FIG. 16. It should be noted that in FIG. 16, the main part is transparent.

The solid state imaging device 8 primarily includes a three-dimensional substrate 10B, two solid state imaging element 20 (corresponding to the first element and the second element of the present invention), and two translucent members 30 (corresponding to the first translucent member and the second translucent member of the present invention).

The three-dimensional substrate 10B is a plate-shaped member in which the widest surfaces (front surface 10b, rear surface 10c) are substantially rectangular. In the present embodiment, the central portion is thinner than the other portions, but the shape of the three-dimensional substrate 10B is not limited thereto.

Similar to the through-hole 12, the through-holes 12a and 12b (corresponding to the first through-hole and the second through-hole of the present invention) are formed in a region where the imaging region 22 of the solid state imaging element 20 is disposed. The through-holes 12a and 12b are formed near both ends in the longitudinal direction (x direction) of the three-dimensional substrate 10B. It should be noted that the shapes of the through-holes 12a and 12b are the same as those of the through-hole 12.

On the rear surface 10c, recessed portions 13c and 13d (corresponding to the first recessed portion and the second recessed portion in the present invention) are formed in which the translucent members 30 are provided. One end of the through-hole 12a is formed in the bottom surface of the recessed portion 13c, and one end of the through-hole 12b is formed in the bottom surface of the recessed portion 13d. Accordingly, similar to the through-holes 12a and 12b, the recessed portions 13c and 13d are formed near both ends of the three-dimensional substrate 10B.

The shape of the recessed portions 13c and 13d are the same as those of the recessed portion 13. Similar to the recessed portion 13, four protruding portions 14 (corresponding to the first protruding portion and the second protruding portion of the present invention) are formed in the recessed portions 13c and 13d so as to cover the four corners (see FIG. 16).

The two translucent members 30 are provided inside the recessed portions 13c and 13d, respectively. In addition, the two solid state imaging elements 20 are placed on the rear surface 10c so as to cover the recessed portions 13c and 13d, respectively.

On the rear surface 10c, a rib 10d is formed around the entire perimeter. In addition, a rib 10e is formed in a region between the recessed portion 13c and the recessed portion 13d on the rear surface 10c. In this way, it is possible to prevent warping or the like of the three-dimensional substrate. Although not illustrated in the drawings, a plurality of band-shaped wirings are formed outside the region where the rib 10e is formed on the rear surface 10c.

Through-holes 10f are formed in the three-dimensional substrate 10B. In the through-holes 10f, the inner peripheral surface and the vicinity thereof are covered with a conductive member (such as copper). The through-holes 10f connect the wiring formed on the rear surface 10c with the wiring formed on the front surface 10b (not illustrated).

The rib 10d is provided with a terminal unit 11 (not illustrated in FIG. 16 and FIG. 17). The terminal unit 11 is electrically connected to the wiring formed on the rear surface 10c.

Next, a method of assembling the solid state imaging device 8 will be described. First, the three-dimensional substrate 10B is placed with the rear surface 10c oriented upward. Next, in each of the recessed portions 13c and 13d, the translucent member 30 is placed on the protruding portion 14. Next, two solid state imaging elements 20 are placed on the rear surface 10c so as to cover the recessed portions 13c and 13d, respectively. Subsequently, the sealing resin 40 is injected between the three-dimensional substrate 10B and the solid state imaging element 20. In this way, the two solid state imaging elements 20 and the two translucent members 30 are attached to the three-dimensional substrate 10B.

According to the present embodiment, it is possible to assemble a solid state imaging device for a compound eye camera in fewer steps. In addition, by forming the through-holes 12a, 12b and the recessed portions 13c, 13d near both ends of the three-dimensional substrate 10B, it is possible to make the base length of the compound eye camera as long as possible.

It should be noted that, in the present embodiment, although the optical axes of the two imaging units (the solid state imaging element 20, the translucent member 30, and the lens (not illustrated), etc.) are parallel, it is also possible to create an arbitrary convergence angle by changing the shape of the three-dimensional substrate 10B.

Embodiments of the invention have been described in detail with reference to the drawings; however, specific configurations are not limited to the embodiments, and changes in the design or the like are also included within a scope which does not depart from the gist of the invention. For example, the above examples have been explained in detail in order to facilitate understanding of the present invention and are not necessarily limited to examples provided with the entirety of the configuration described above. In addition, the configuration of an embodiment may be partially replaced with the configuration of a different embodiment, or the configuration of the different embodiment may be added to, deleted from, or replaced with the configuration of the embodiment.

Further, the term "substantially" in the present invention is not to be understood as merely being strictly the same, and is a concept that includes variations and modifications to an extent that does not result in loss in identity. For example, the expression "substantially rectangular" is not limited to the case of strictly rectangular shapes, but is a concept that includes a margin of error (for example, including a portion having a curve). Further, for example, in cases where the expression "rectangular shape" is used, this includes not only the case of strictly rectangular shapes, but cases of approximately rectangular shapes and the like.

Furthermore, the meaning of the term "vicinity" in the present invention includes a region of a range (which can be determined as desired) near a position serving as a reference. For example, the expression "the vicinity of the edge" is a concept that refers to a region within a range of the edge, and may include or not include the edge itself.

REFERENCE SIGNS LIST 1, 2, 3, 5, 6, 7, 8 Solid state imaging device
4 Light emitting device
10, 10A, 10B Three-dimensional substrate
10a, 10c Rear surface
10b Front surface
10d, 10e Rib
10f Through-hole
11 Terminal unit
12, 12a, 12b Through-hole
13, 13c, 13d Recessed portion
13a Bottom surface
13b Side surface
14, 14A Protruding portion
15 Protruding portion
16 Step
17 Recessed portion
17a Bottom surface
18 Protruding portion
20, 20A Solid state imaging element
20a Front surface
20b Rear surface
21, 26, 28 Bump
22 Imaging region
25 Light emitting element
27 Light emitting region
30 Translucent member
30a Front surface
30b Side surface
30c Rear surface 31 Lens
32 Translucent member
40 Sealing resin
41 Light-shielding resin
42 Adhesive agent
50 Ground electrode
50a Side surface
51 Protruding portion
60 Flexible substrate
61 Base material
62 Metal foil
63 Insulator
64 Plate material
100 Substrate

The invention claimed is:

1. An optical device comprising:
a three-dimensional substrate having a three-dimensional shape;
an element provided on the three-dimensional substrate, the element being a light receiving element for receiving light or a light emitting element for emitting light; and
a translucent member provided on the three-dimensional substrate, wherein
the three-dimensional substrate includes:
a recessed portion formed on a rear surface,
a through-hole penetrating in a plate thickness direction, one end of the through-hole being formed in a bottom surface of the recessed portion, and
four protruding portions having a columnar shape formed on the bottom surface of the recessed portion, the four protruding portions being formed not to come into contact with a side surface of the recessed portion and to cover each of four corners of the through-hole;
the translucent member is provided inside the recessed portion to cover the through-hole;
the element is provided on the rear surface of the three-dimensional substrate to cover the recessed portion;
a first surface of the translucent member abuts the protruding portion; and
the element and the translucent member are integrated with the three-dimensional substrate by a sealing resin filled between the three-dimensional substrate and the element, between a second surface opposed to the first surface of the translucent member and the element, between a side surface adjacent to the first surface and the second surface of the translucent member and the three-dimensional substrate, and between the first surface of the translucent member and the three-dimensional substrate.

2. The optical device according to claim 1, wherein:
the sealing resin includes a particulate filler material; and
the protruding portion is formed at a height of greater than or equal to twice a maximum particle diameter of the filler material.

3. The optical device according to claim 2, wherein:
the sealing resin is a resin having light shielding characteristics; and
the sealing resin covers an entire rear surface of the element.

4. The optical device according to claim 2, further comprising a substantially plate-shaped electrode provided on a surface of the element that is not opposed to the three-dimensional substrate, wherein
the sealing resin integrates the electrode and the element as well as the electrode and the three-dimensional substrate.

5. The optical device according to claim 1, wherein an adhesive agent for preliminarily fixing the translucent member is applied to the bottom surface of the recessed portion on an outer side of the protruding portion.

6. The optical device according to claim 5, wherein:
the sealing resin is a resin having light shielding characteristics; and
the sealing resin covers an entire rear surface of the element.

7. The optical device according to claim 5, further comprising a substantially plate-shaped electrode provided on a surface of the element that is not opposed to the three-dimensional substrate, wherein
the sealing resin integrates the electrode and the element as well as the electrode and the three-dimensional substrate.

8. The optical device according to claim 1, wherein:
the sealing resin is a resin having light shielding characteristics; and
the sealing resin covers an entire rear surface of the element.

9. The optical device according to claim 1, further comprising a substantially plate-shaped electrode provided on a surface of the element that is not opposed to the three-dimensional substrate, wherein
the sealing resin integrates the electrode and the element as well as the electrode and the three-dimensional substrate.

10. The optical device according to claim 1, further comprising a flexible substrate including a circuit pattern formed of a metal foil formed on a substantially rectangular film-like base material formed of an insulating material, wherein
the element includes a bump formed of a conductive material;
an end portion of the flexible substrate is provided on the rear surface of the three-dimensional substrate;
the element is provided on the rear surface of the three-dimensional substrate so as to sandwich the flexible substrate with the rear surface of the three-dimensional substrate; and
the protruding portion and the circuit pattern are in contact with each other when the element is provided on the rear surface of the three-dimensional substrate.

11. An optical device comprising:
a three-dimensional substrate having a three-dimensional shape;
two elements including a first element and a second element provided on the three-dimensional substrate, the first element and the second element being light receiving elements for receiving light or light emitting elements for emitting light; and
a first translucent member and a second translucent member provided on the three-dimensional substrate, wherein
the three-dimensional substrate includes:
a first recessed portion and a second recessed portion formed on a rear surface,
a first through-hole which penetrates in a plate thickness direction and has one end formed in a bottom surface of the first recessed portion,
a second through-hole which penetrates in the plate thickness direction and has one end formed in a bottom surface of the second recessed portion, four first protruding portions having a columnar shape formed on the bottom surface of the first recessed portion, the four first protruding portions being formed not to come into contact with a side surface of the first recessed portion and to cover each of four corners of the first through-hole, and four second protruding portions having a columnar shape formed on the bottom surface of the second recessed portion, the four second protruding portions being formed not to come into contact with a side surface of the second recessed portion and to cover each of four corners of the second through-hole;

the first translucent member is provided inside the first recessed portion to cover the first through-hole;

the second translucent member is provided inside the second recessed portion to cover the second through-hole;

the first element is provided on the rear surface of the three-dimensional substrate to cover the first recessed portion;

the second element is provided on the rear surface of the three-dimensional substrate to cover the second recessed portion;

a first surface of the first translucent member abuts the first recessed portion, and a third surface of the second translucent member abuts the second recessed portion;

the first element and the first translucent member are integrated with the three-dimensional substrate by a sealing resin filled between the three-dimensional substrate and the first element, between a second surface opposed to the first surface of the first translucent member and the first element, between a side surface adjacent to the first surface and the second surface and the three-dimensional substrate, and between the first surface and the three-dimensional substrate; and the second element and the second translucent member are integrated with the three-dimensional substrate by a sealing resin to be filled between the three-dimensional substrate and the second element, between a fourth surface opposed to the third surface of the second translucent member and the first element, between a side surface adjacent to the third surface and the fourth surface and the three-dimensional substrate, and between the third surface and the three-dimensional substrate.

12. The optical device according to claim 11, wherein:
a widest surface of the three-dimensional substrate is a substantially rectangular plate-shaped member; and
each of the first recessed portion and the second recessed portion are respectively formed near both ends in a longitudinal direction of the three-dimensional substrate.

13. The optical device according to claim 12, wherein:
a rib is formed in a region between the first recessed portion and the second recessed portion on the rear surface of the three-dimensional substrate; and
a plurality of band-shaped wires are formed outside the region where the rib is formed.

14. The optical device according to claim 11, wherein:
a rib is formed in a region between the first recessed portion and the second recessed portion on the rear surface of the three-dimensional substrate; and
a plurality of band-shaped wires are formed outside the region where the rib is formed.

15. A method of manufacturing an optical device, the method comprising:
placing, with a rear surface oriented upward, a three-dimensional substrate having a three-dimensional shape, the three-dimensional substrate including:
a recessed portion formed on the rear surface,
a through-hole penetrating in a plate thickness direction, one end of the through-hole being formed in a bottom surface of the recessed portion, and
four protruding portions having a columnar shape formed on the bottom surface of the recessed portion, the four protruding portions being formed not to come into contact with a side surface of the recessed portion and to cover each of four corners of the through-hole;
placing a translucent member inside the recessed portion to cover the through-hole by bringing a first surface of the translucent member into contact with the protruding portion;
placing, to cover the recessed portion, an element that is a light receiving element for receiving light or a light emitting element for emitting light on the rear surface of the three-dimensional substrate; and
integrating the element and the translucent member with the three-dimensional substrate by filling a sealing resin between the three-dimensional substrate and the element, between a second surface opposed to the first surface of the translucent member and the element, between a side surface adjacent to the first surface and the second surface of the translucent member and the three-dimensional substrate, and between the first surface of the translucent member and the three-dimensional substrate.

16. The method of manufacturing the optical device according to claim 15, further comprising applying, between placing the three-dimensional substrate with the rear surface oriented upward and placing the translucent member inside the recessed portion to cover the through-hole by bringing a first surface of the translucent member into contact with the protruding portion, an adhesive agent to preliminarily fix the translucent member to a location outside the protruding portions in the bottom surface of the recessed portion.

* * * * *